(12) United States Patent
Nakamoto et al.

(10) Patent No.: US 7,820,230 B2
(45) Date of Patent: Oct. 26, 2010

(54) PLASMA DOPING PROCESSING DEVICE AND METHOD THEREOF

(75) Inventors: Keiichi Nakamoto, Osaka (JP); Yuichiro Sasaki, Osaka (JP); Katsumi Okashita, Osaka (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 59 days.

(21) Appl. No.: 12/439,298

(22) PCT Filed: Aug. 28, 2008

(86) PCT No.: PCT/JP2008/002341

§ 371 (c)(1), (2), (4) Date: Feb. 27, 2009

(87) PCT Pub. No.: WO2009/028191

PCT Pub. Date: Mar. 5, 2009

(65) Prior Publication Data

US 2009/0317963 A1 Dec. 24, 2009

(30) Foreign Application Priority Data

Aug. 31, 2007 (JP) .............................. 2007-225500

(51) Int. Cl.
*C23C 16/52* (2006.01)
(52) U.S. Cl. ........................... 427/8; 427/569; 118/712; 118/723 E
(58) Field of Classification Search ................ 118/712, 118/723 E; 427/8, 569
See application file for complete search history.

(56) References Cited

U.S. PATENT DOCUMENTS

| 4,912,065 A | 3/1990 | Mizuno et al. |
| 5,270,266 A | 12/1993 | Hirano et al. |
| 6,254,398 B1 | 7/2001 | Chen |
| 2003/0153101 A1* | 8/2003 | Takase et al. .................. 438/7 |
| 2004/0011468 A1 | 1/2004 | Hirose et al. |
| 2004/0036038 A1* | 2/2004 | Okumura et al. ......... 250/492.2 |
| 2004/0212946 A1 | 10/2004 | Kellerman et al. |

FOREIGN PATENT DOCUMENTS

| JP | 61-39519 | 2/1986 |
| JP | 02-308529 | 12/1990 |
| JP | 05-166757 | 7/1993 |

(Continued)

OTHER PUBLICATIONS

International Preliminary Report on Patentability and Written Opinion of the International Searching Authority, issued in corresponding International Patent Application No. PCT/JP2008/002341, dated on Mar. 18, 2010.

*Primary Examiner*—Timothy H Meeks
*Assistant Examiner*—Elizabeth Burkhart
(74) *Attorney, Agent, or Firm*—McDermott Will & Emery LLP

(57) ABSTRACT

An amount of leakage of a substrate-cooling gas into a vacuum container is measured by using a flow-rate measuring device so that the flow rate of a diluting gas that is the same as the substrate-cooling gas is controlled by a control device or a plasma doping time is prolonged, in accordance with the amount of leakage.

24 Claims, 13 Drawing Sheets

FOREIGN PATENT DOCUMENTS

| | | |
|---|---|---|
| JP | 07-161696 | 6/1995 |
| JP | 07-231032 | 8/1995 |
| JP | 2004-047696 | 2/2004 |
| JP | 2005-072521 | 3/2005 |
| JP | 2005-136350 | 5/2005 |
| JP | 2007-134520 | 5/2007 |
| WO | WO 02/084724 A1 | 10/2002 |
| WO | WO 2004/095477 A2 | 11/2004 |
| WO | WO 2006/098109 A1 | 9/2006 |

\* cited by examiner

PLASMA DOPING PROCESSING DEVICE AND METHOD THEREOF

RELATED APPLICATIONS

This application is the U.S. National Phase under 35 U.S.C. §371 of International Application No. PCT/JP2008/002341, filed on Aug. 28, 2008, which in turn claims the benefit of Japanese Application No. 2007-225500, filed on Aug. 31, 2007, the disclosures of which Applications are incorporated by reference herein.

TECHNICAL FIELD

The present invention relates to a semiconductor manufacturing apparatus and a manufacturing method thereof, and in particular to a plasma doping processing device and method that introduce an impurity onto a surface of a substrate that serves as a solid sample such as a semiconductor substrate.

BACKGROUND ART

A plasma doping method by which an impurity is ionized and introduced into a solid matter at low energy has been known as a technique for introducing the impurity onto the surface of a substrate that serves as a solid sample (for example, refer to Patent Document 1).

FIG. 14 shows a structure of a plasma processing device (for example, refer to Patent Documents 2 and 3). In FIG. 14, a lower electrode 103 on which a sample 106 made of a silicon substrate is placed is arranged in a vacuum container 111.

A doping material gas containing a desired impurity element is supplied into the vacuum container 111 by using a doping material gas supply device 110a and a doping material gas supply device 110c installed in a gas supply device 110, while a diluting gas is supplied from a diluting gas supply device 110b and a diluting gas supply device 110d, so that a doping gas in which the doping material gas and the diluting gas are mixed with each other is allowed to pass through a first gas supply pipe 142 and a second gas supply pipe 143 respectively, and supplied into the vacuum container 111 through a gas supply inlet 109. A pressure-adjusting valve 102 used for keeping the pressure of the vacuum container 111 constant is installed, and the supplied doping gas is allowed to pass through the vacuum container 111 and discharged from an exhaust pump 101. A quartz top plate serving as a dielectric window 107 is arranged on the upper face of the vacuum container 111, and a coil 108 used for exciting plasma is arranged thereon. A high-frequency power supply 105 is connected to the coil 108 so that a high-frequency power is supplied to the coil 108. An electric field, generated by the high-frequency power supplied to the coil 108, is supplied to the inside of the vacuum container 111 through the dielectric window 107. A doping material gas, supplied into the vacuum container 111, receives energy by this electric field to form a plasma state of ions or radicals that give influences to the plasma doping process. Moreover, a high-frequency power supply 104 is connected to the lower electrode 103 so that a desired voltage can be generated on the lower electrode 103, and the voltage generated on the lower electrode 103 has a negative electric potential relative to the plasma. Furthermore, by applying a voltage by a DC power supply 119 to an electrostatic adsorption electrode 118 placed inside the lower electrode 103 (see FIG. 15 or FIG. 16), the sample 106 is electrostatically adsorbed onto the lower electrode 103, and a helium gas, serving a substrate-cooling gas, is supplied between the sample 106 and the lower electrode 103.

As the system for supplying a helium gas between the sample 106 and the lower electrode 103, a closed loop controlling system shown in FIG. 15 and an open loop controlling system shown in FIG. 16 have been known.

In the closed loop controlling system in FIG. 15, the helium gas, supplied through a helium gas supply inlet 120, is allowed to enter a substrate-cooling helium gas pressure-adjusting and flow-rate controlling unit 114 through a valve 113, and supplied between the sample 106 and the lower electrode 103 through a valve 115, while being pressure-adjusted and flow-rate-controlled by the substrate-cooling helium gas pressure-adjusting and flow-rate controlling unit 114. At this time, a valve 116 is kept in a closed state. In contrast, when the supplied helium gas is discharged by the exhaust pump 117, the valve 116 is kept in an open state.

Here, in the open loop controlling system in FIG. 16, the helium gas is supplied through a helium supply inlet 120, and allowed to enter a substrate-cooling helium gas flow-rate controlling unit 123 through a valve 128, and the helium gas that has been flow-rate controlled in the substrate-cooling helium gas flow-rate controlling unit 123 is allowed to pass through valves 127 and 126, and supplied between the sample 106 and the lower electrode 103. At this time, a valve 121 is kept in a closed state. The supplied helium gas is allowed to enter a substrate-cooling helium gas pressure-adjusting and flow-rate controlling unit 124 so that the helium gas, pressure-adjusted and simultaneously flow-rate controlled by the substrate-cooling helium gas pressure-adjusting and flow-rate controlling unit 124, is allowed to pass through valves 125 and 122, and discharged by an exhausting pump 117. Upon discharging the supplied helium gas, the valve 121 is kept in an open state.

In the plasma processing device having the structure as described above, a plasma doping material gas, supplied into the vacuum container 111 through the gas supply inlet 109, for example, $B_2H_6$, is formed into a plasma state by an electric field generated by a coil 108 to which a high-frequency power is applied, so that boron ions in the plasma are introduced onto the surface of the sample 106 by a voltage having a negative potential relative to the plasma generated on the lower electrode 103 by the high-frequency power supply 104.

After a metal wiring layer is formed on the sample 106 to which the impurity is thus introduced, a thin oxide film is formed on the metal wiring layer in a predetermined oxide film atmosphere, and a gate electrode is then formed on the sample 106 by using a CVD device or the like, so that, for example, an MOS transistor can be obtained.

In a conventional plasma processing device, under control of a control device 140, the closed loop control system in FIG. 15 measures the flow rate of the helium gas by using the substrate-cooling helium gas pressure-adjusting and flow-rate controlling unit 114, while the open loop control system in FIG. 16 measures the low rate of the helium gas by using the substrate-cooling helium gas flow-rate controlling unit 123 and the substrate-cooling helium gas pressure-adjusting and flow-rate controlling unit 124 so that based upon a threshold value, a determination is made as to whether or not there is any leakage of the helium gas into the vacuum container 111. When the determination indicates that the helium gas is leaking into the vacuum container 111, the plasma processing is suspended. Next, under control of the control device 140, the sample 106 on which the plasma processing has been suspended is taken out from the vacuum container 111 by using a known method or the like, not shown, and the succeeding processes on the sample 106 are terminated.

In the plasma doping processing device also, based upon a threshold value, a determination is made as to whether or not there is any leakage of the helium gas into the vacuum container 111, and when the determination indicates that the helium gas is leaking into the vacuum container 111, the plasma doping processing is suspended. Next, under control of the control device 140, the sample 106 on which the plasma processing has been suspended is taken out from the vacuum container 111 by using a known method or the like, not shown, and the succeeding processes on the sample 106 are terminated.

Patent Document 1: U.S. Pat. No. 4,912,065
Patent Document 2: JP-A No. 2005-72521
Patent Document 3: JP-A No. 2004-47696

DISCLOSURE OF INVENTION

Subject to be Solved by the Invention

The present inventors have found that the helium gas to be supplied between the sample 106 and the lower electrode 103 might leak into the vacuum container 111 once every several thousand times. In the case where the flow rate of the helium gas leaked into the vacuum container 111 is large, the amount of introduction of an impurity varies beyond a permissible value of a desired amount of introduction of the impurity into the sample 106. Since the sample 106 having the amount of introduction exceeding the permissible value fails to further proceed to the succeeding processes to cause a defective product, resulting in an issue of a reduction in the yield.

Here, even when only the determination criteria of the amount of leakage of the helium gas into the vacuum container 111 is made severer under control of the control device 140, the plasma processing or the plasma doping processing is suspended as described above, failing to introduce a desired amount of an impurity into the sample 106 and further carry out the succeeding processes to cause a defective product, resulting in an issue of a reduction in the yield.

An object of the present invention is to provide a plasma doping processing device and method, which can improve the reproducibility of the amount of introduction of an impurity with high precision and increase the yield in a plasma doping process.

Means for Solving the Subject

In order to achieve the above object, the present invention has the following construction.

According to a first aspect of the present invention, there is provided a plasma doping processing device comprising:

a vacuum container having a top plate on an upper portion thereof;

a lower electrode that is arranged in the vacuum container, with a substrate serving as a sample being mounted thereon;

a high frequency power supply for applying a high frequency power to the lower electrode;

a gas exhausting device for exhausting inside of the vacuum container;

a plasma doping gas supply device for supplying a plasma doping gas that contains a doping material gas containing an impurity and a diluting gas into the vacuum container;

an electrode for electrostatic adsorption placed on the lower electrode;

a DC power supply for applying a voltage to the electrode for electrostatic adsorption;

a flow-rate measuring device for measuring a flow rate of a substrate-cooling gas that is same as the diluting gas and is supplied between the substrate and the lower electrode so as to measure an amount of leakage of the substrate-cooling gas into the vacuum container; and a control device for controlling the plasma doping gas supply device so as to reduce an amount of supply of the diluting gas in accordance with the amount of leakage measured by the flow-rate measuring device, wherein the plasma doping processing device carries out a plasma doping process on the substrate.

According to a second aspect of the present invention, there is provided a plasma doping processing device comprising:

a vacuum container having a top plate on an upper portion thereof;

a lower electrode that is arranged in the vacuum container, with a substrate serving as a sample being mounted thereon;

a high frequency power supply for applying a high frequency power to the lower electrode;

a gas exhausting device for exhausting inside of the vacuum container;

a plasma doping gas supply device for supplying a plasma doping gas that contains a doping material gas containing an impurity and a diluting gas into the vacuum container;

an electrode for electrostatic adsorption placed on the lower electrode;

a DC power supply for applying a voltage to the electrode for electrostatic adsorption;

a flow-rate measuring device for measuring a flow rate of a substrate-cooling gas that is same as the diluting gas and is supplied between the substrate and the lower electrode so as to measure an amount of leakage of the substrate-cooling gas into the vacuum container; and a control device for controlling the high frequency power supply, the gas exhausting device, the plasma doping gas supply device, and the DC power supply so as to prolong a plasma doping processing time in accordance with the amount of leakage measured by the flow-rate measuring device, wherein the plasma doping processing device carries out a plasma doping process on the substrate.

According to a third aspect of the present invention, there is provided the plasma doping processing device according to the first aspect, wherein the control device controls the plasma doping gas supply device so as to reduce the amount of supply of the diluting gas that is equivalent to the amount of leakage measured by the flow-rate measuring device so that the plasma doping gas supply device is controlled so as to reduce the amount of supply of the diluting gas in accordance with the amount of leakage measured by the flow-rate measuring device.

According to a fourth aspect of the present invention, there is provided the plasma doping processing device according to the third aspect, wherein the control device controls the plasma doping gas supply device within a flow rate ranging from 110% to 90% of the amount of leakage measured by the flow-rate measuring device so that the plasma doping gas supply device is controlled so as to reduce the amount of supply of the diluting gas in accordance with the amount of leakage measured by the flow-rate measuring device.

According to a fifth aspect of the present invention, there is provided The plasma doping processing device according to the second aspect, comprising:

a storage unit for storing relationship information between a plasma doping time and an amount of introduction of the impurity onto the substrate, wherein the control device determines a period of the plasma doping processing time based upon the relationship information between the plasma doping time and the amount of introduction of the impurity onto the substrate stored in the storage unit, and also controls the high frequency power supply, the gas exhausting device, the plasma doping gas supply device, and the DC power supply so as to prolong the plasma doping processing time up to the time thus determined.

According to a sixth aspect of the present invention, there is provided the plasma doping processing device according to any one of the first to fifth aspects, wherein in a case where the amount of leakage measured by the flow-rate measuring device is not more than an error determining threshold value, the control device carries out a plasma doping process without carrying out the control by the control device, while in a case where the amount of leakage measured by the flow-rate measuring device is more than the error determining threshold value, the control device carries out a plasma doping process, with the control being carried out by the control device.

According to a seventh aspect of the present invention, there is provided the plasma doping processing device according to any one of the first to sixth aspects, wherein in a case where the amount of leakage measured by the flow-rate measuring device is not more than a processing permissible threshold value, the control device carries out a plasma doping process with the control being carried out by the control device, while in a case where the amount of leakage measured by the flow-rate measuring device is more than the processing permissible threshold value, the control device stops a plasma doping process.

According to an eighth aspect of the present invention, there is provided the plasma doping processing device according to any one of the first to seventh aspects, wherein the substrate-cooling gas is a helium gas.

According to a ninth aspect of the present invention, there is provided the plasma doping processing device according to any one of the first to eighth aspects, wherein the plasma doping gas supply device is a device for supplying a gas containing $B_2H_6$ as the doping material gas.

According to a 10th aspect of the present invention, there is provided the plasma doping processing device according to any one of the first to eighth aspects, wherein the plasma doping gas supply device is a device for supplying a gas that contains boron and is diluted by rare gas or hydrogen, as the plasma doping gas.

According to an 11th aspect of the present invention, there is provided the plasma doping processing device according to any one of the first to eighth aspects, wherein the plasma doping gas supply device is a device for supplying a gas that contains boron and is diluted by helium or hydrogen, as the plasma doping gas.

According to a 12th aspect of the present invention, there is provided the plasma doping processing device according to any one of the first to eighth aspects, wherein the plasma doping gas supply device is a device for supplying a gas that contains the impurity and is diluted by rare gas or hydrogen, as the plasma doping gas, with the doping material gas containing the impurity having a concentration of 5.0 mass % or less.

According to a 13th aspect of the present invention, there is provided a plasma doping processing method comprising:

placing a substrate serving as a sample on a lower electrode that is arranged in a vacuum container having a top plate on an upper portion thereof;

applying a voltage from a DC power supply to an electrode for electrostatic adsorption arranged on the lower electrode;

applying a high frequency power from a high frequency power supply to the lower electrode, with the vacuum container being exhausted by a gas exhausting device, while supplying a plasma doping gas that contains a doping material gas containing an impurity and a diluting gas into the vacuum container from a plasma doping gas supply device;

supplying a substrate-cooling gas that is same as the diluting gas between the substrate and the lower electrode;

measuring a flow rate of the substrate-cooling gas so as to measure an amount of leakage of the substrate-cooling gas into the vacuum container by using a flow-rate measuring device;

controlling the plasma doping gas supply device by using a control device so as to reduce the amount of supply of the diluting gas in accordance with the amount of leakage measured by the flow-rate measuring device; and thereafter, carrying out a plasma doping process on the substrate.

According to a 14th aspect of the present invention, there is provided a plasma doping processing method comprising:

placing a substrate serving as a sample on a lower electrode that is arranged in a vacuum container having a top plate on an upper portion thereof;

applying a voltage from a DC power supply to an electrode for electrostatic adsorption arranged on the lower electrode;

applying a high frequency power from a high frequency power supply to the lower electrode, with the vacuum container being exhausted by a gas exhausting device, while supplying a plasma doping gas that contains a doping material gas containing an impurity and a diluting gas into the vacuum container from a plasma doping gas supply device;

supplying a substrate-cooling gas that is same as the diluting gas between the substrate and the lower electrode;

measuring a flow rate of the substrate-cooling gas so as to measure an amount of leakage of the substrate-cooling gas into the vacuum container by using a flow-rate measuring device;

controlling the high-frequency power supply, the gas exhausting device, the plasma doping gas supply device, and the DC power supply by using a control device so as to prolong a plasma doping processing time in accordance with the amount of leakage measured by the flow-rate measuring device; and thereafter, carrying out a plasma doping process on the substrate.

According to a 15th aspect of the present invention, there is provided the plasma doping processing method according to the 13th aspect, wherein upon controlling the plasma doping gas supply device by using the control device, the control device controls the plasma doping gas supply device so that, based upon relationship information between a flow rate of the diluting gas to be supplied into the vacuum container or a mass concentration of the impurity gas and a sheet resistance value of a dummy substrate that has a same size and is made of a same material as those of the substrate, a supply amount of the diluting gas is reduced in accordance with the amount of leakage measured by the flow-rate measuring device.

According to a 16th aspect of the present invention, there is provided the plasma doping processing method according to the 13th aspect, comprising:

prior to controlling the plasma doping gas supply device by the control device, carrying out the impurity plasma doping process on a dummy substrate that has a same size and is made of a same material as those of the substrate in place of the substrate so that the impurity is introduced onto the dummy substrate;

next electrically activating the impurity of the dummy substrate by using an annealing process;

next measuring a sheet resistance value of the dummy substrate, and storing results of measurements in a storage unit, and further altering the flow rate of the diluting gas, without altering the flow rate of the impurity gas to be supplied into the vacuum container, so that the impurity is introduced onto the other dummy substrate that has the same size and is made of the same material as those of the substrate;

next electrically activating the impurity of the other dummy substrate by using an annealing process;

next measuring a sheet resistance value of the other dummy substrate, and storing results of measurements in the storage unit, and storing relationship information between a flow rate of the diluting gas to be supplied into the vacuum container or a mass concentration of the impurity gas and a sheet resistance value in the storage unit; and thereafter, upon controlling the plasma doping gas supply device by using the control device, controlling the plasma doping gas supply device by the control device so that, based upon the relationship information between the flow rate of the diluting gas to be supplied into the vacuum container or the mass concentration of the impurity gas and the sheet resistance value of the dummy substrate that has the same size and is made of the same material as those of the substrate, a supply amount of the diluting gas is reduced in accordance with the amount of leakage measured by the flow-rate measuring device.

According to a 17th aspect of the present invention, there is provided The plasma doping processing method according to the 14th aspect, comprising:

prior to controlling the plasma doping gas supply device by the control device, carrying out the impurity plasma doping process on a dummy substrate that has a same size and is made of a same material as those of the substrate in place of the substrate so that the impurity is introduced onto the dummy substrate;

next electrically activating the impurity of the dummy substrate by using an annealing process;

next measuring a sheet resistance value of the dummy substrate, and storing results of measurements in a storage unit, and further altering the plasma doping time, so that the impurity is introduced onto the other dummy substrate that has the same size and is made of the same material as those of the substrate;

next electrically activating the impurity of the other dummy substrate by using an annealing process;

next measuring a sheet resistance value of the other dummy substrate, and storing results of measurements in the storage unit, and storing relationship information between a plasma doping time and a sheet resistance value in the storage unit; and thereafter, upon controlling the plasma doping gas supply device by using the control device, controlling the high-frequency power supply, the gas exhausting device, the plasma doping gas supply device, and the DC power supply by the control device so as to prolong the plasma doping processing time in accordance with the amount of leakage measured by the flow-rate measuring device.

According to an 18th aspect of the present invention, there is provided the plasma doping processing method according to the 14th aspect, wherein, upon controlling the high-frequency power supply, the gas exhausting device, the plasma doping gas supply device, and the DC power supply by using the control device, in a case where the control device has determined that there is no leakage of the substrate-cooling gas into the vacuum container based upon the amount of leakage measured by the flow-rate measuring device, the plasma doping process is carried out without carrying out the controlling processes by the control device, while in a case where the control device has determined that there is any leakage of the substrate-cooling gas into the vacuum container based upon the amount of leakage measured by the flow-rate measuring device, the control device controls the high-frequency power supply, the gas exhausting device, the plasma doping gas supply device, and the DC power supply so as to prolong the plasma doping time to correspond to the plasma doping time found as results of comparisons between the relationship information stored in the storage unit and the amount of leakage measured by the flow-rate measuring device, under control of the control device.

According to a 19th aspect of the present invention, there is provided The plasma doping processing method according to the 13th aspect, wherein, upon controlling the plasma doping gas supply device by using the control device, in a case where the control device has determined that there is no leakage of the substrate-cooling gas into the vacuum container based upon the amount of leakage measured by the flow-rate measuring device, the plasma doping process is carried out without carrying out the controlling processes by the control device, while in a case where the control device has determined that there is any leakage of the substrate-cooling gas into the vacuum container based upon the amount of leakage measured by the flow-rate measuring device, the control device controls the plasma doping gas supply device so that under control of the control device, the flow rate of the substrate-cooling gas is reduced from the flow rate of the diluting gas, with the reduced amount being supplied into the vacuum container.

According to a 20th aspect of the present invention, there is provided the plasma doping processing method according to any one of the 13th to 19th aspects, wherein the substrate-cooling gas is a helium gas.

According to a 21st aspect of the present invention, there is provided the plasma doping processing method according to any one of the 13th to 20th aspects, wherein upon supplying the plasma doping gas from the plasma doping gas supply device, a gas that contains the impurity and is diluted by rare gas or hydrogen is supplied as the plasma doping gas, with the doping material gas containing the impurity having a concentration of 5.0 mass % or less.

According to a 22nd aspect of the present invention, there is provided the plasma doping processing method according to any one of the 13th to 20th aspects, wherein upon supplying the plasma doping gas from the plasma doping gas supply device, a gas that contains boron and is diluted by rare gas or hydrogen is supplied as the plasma doping gas.

According to a 23rd aspect of the present invention, there is provided the plasma doping processing method according to any one of the 13th to 20th aspects, wherein upon supplying the plasma doping gas from the plasma doping gas supply device, a gas that contains $B_2H_6$ is supplied as the doping material gas.

According to a 24th aspect of the present invention, there is provided the plasma doping processing method according to any one of the 13th to 20th aspects, wherein the substrate-cooling gas is a helium gas.

According to a 25th aspect of the present invention, there is provided the plasma doping processing method according to any one of the 13th to 16th aspects, wherein upon supplying the plasma doping gas from the plasma doping gas supply device into the vacuum container, the plasma doping gas that contains boron and is diluted by rare gas or hydrogen has a total flow rate that is set to $500 \times X$ $cm^3/min$ or less, supposing that an error determination threshold value of an amount of leakage into the vacuum container of the substrate-cooling gas to be supplied between the substrate and the lower electrode is set to X $cm^3/min$.

According to a 26th aspect of the present invention, there is provided the plasma doping processing method according to any one of the 13th to 25th aspects, wherein upon supplying the plasma doping gas from the plasma doping gas supply device, the diluting gas for the plasma doping gas is a helium gas.

According to a 27th aspect of the present invention, there is provided the plasma doping processing method according to the 22nd aspect, wherein upon supplying the plasma doping gas from the plasma doping gas supply device, phosphorus is used in place of boron in the plasma doping gas.

According to a 28th aspect of the present invention, there is provided the plasma doping processing method according to the 22nd aspect, wherein upon supplying the plasma doping gas from the plasma doping gas supply device, arsenic is used in place of boron in the plasma doping gas.

EFFECTS OF THE INVENTION

Even in the case where, upon introducing an impurity onto a substrate that is a sample in a plasma doping process, a substrate-cooling gas leaks into the vacuum container, the present invention makes it possible to correct variations in sheet resistance due to the leakage of the substrate-cooling gas into the vacuum container.

Therefore, it becomes possible to provide high-precision reproducibility of the amount of introduction of the impurity by the plasma doping, and consequently to improve the yield.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1A:
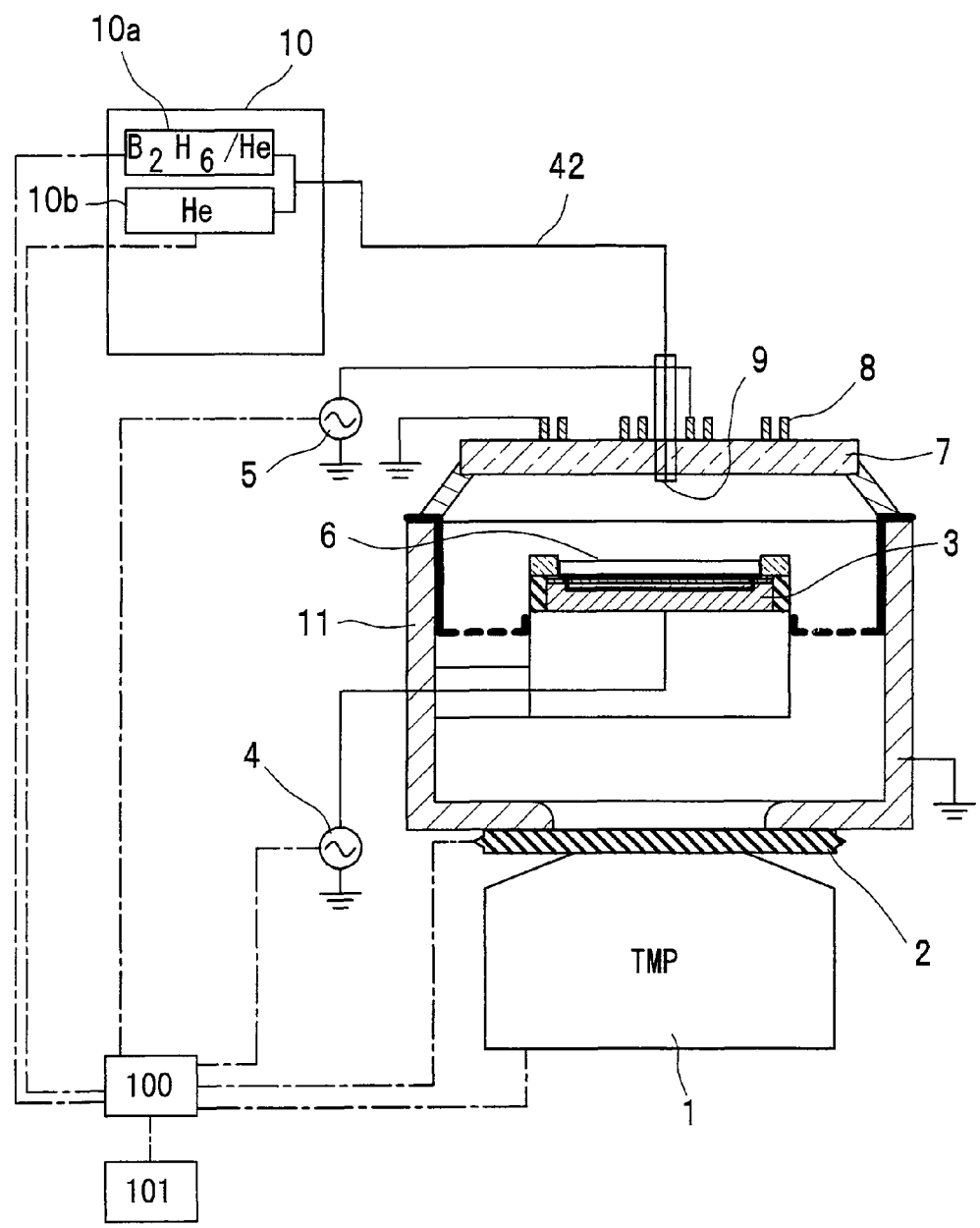
FIG. 1A is a schematic view that shows a structure of a plasma doping processing device in accordance with one embodiment of the present invention.

Referring to the drawings, the following description will discuss embodiments in accordance with the present invention in detail.

As shown in FIG. 1A, a plasma doping processing device in accordance with a first embodiment of the present invention is provided with a vacuum container 11 (one example of a vacuum chamber) having a top plate 7 on its upper portion, a lower electrode 3 that is arranged in the middle portion of the vacuum container 11, with a substrate 6 serving one example of a sample being mounted on its upper face, a high frequency power supply 4 for applying a high frequency power to the lower electrode 3, a gas exhausting device 1 that is arranged on the bottom face of the vacuum container 11 for exhausting the inside of the vacuum container 11, a gas supply device 10 for supplying a plasma doping gas into the vacuum container 11, an electrode 18 for electrostatic adsorption arranged inside the lower electrode 3, and a DC power supply 19 for applying a voltage to the electrode 18 for electrostatic adsorption so that it is designed to carry out a plasma doping process on the sample 6.

In the gas supply device 10, a doping material gas containing a desired impurity element, for example, a $B_2H_6$ gas, and a diluting gas are respectively supplied from a doping material gas supply device 10a and a diluting gas supply device 10b, and mixed in a gas supply pipe 42, and the mixed gas is then supplied into the vacuum container 11 through a gas supply inlet 9. Thus, the gas supply device 10 serves as a device for supplying the gas that contains the impurity and is diluted by rare gas or hydrogen, as the plasma doping gas, and the concentration of the doping material gas containing the impurity is preferably set to 5.0 mass % or less. It is desirable not to use a gas having a concentration of the doping material gas of more than 5.0 mass % since there is a possibility of explosion of $B_2H_6$. Moreover, it is difficult to form a gas having a concentration of 5.0 mass % or more. Therefore, with respect to preparation of the gas containing the impurity to be applicable, either of the following two cases is proposed: a gas containing only $B_2H_6$ is used as the gas containing the impurity and the gas containing only $B_2H_6$ is mixed with a diluting gas and then supplied, or a gas containing the impurity of 5.0 mass % or less and the diluting gas are mixed and supplied. However, in the case where only $B_2H_6$ is used and mixed with the diluting gas, these tend to be easily mixed with a concentration that is highly possible to cause an explosion, resulting in a dangerous state. For this reason, a gas containing an impurity of 5.0 mass % or less is preferably used.

A pressure-adjusting valve 2 used for maintaining the pressure inside the vacuum container 11 at a constant pressure is installed on the bottom face of the vacuum container 11 so that a doping gas, supplied into the vacuum container 11, is allowed to pass through the vacuum container 11 and discharged by the exhausting pump 1 through the pressure-adjusting valve 2.

The quartz top plate serving as a dielectric window 7 is arranged on the upper face of the vacuum container 11, and a coil 8 used for exciting plasma is arranged thereon. A high-frequency power supply 5 is connected to the coil 8 so that a high-frequency power is supplied to the coil 8. An electric field, generated by the high-frequency power supplied to the coil 8, is supplied to the inside of the vacuum container 11 through the dielectric window 7. A doping material gas, supplied into the vacuum container 11, receives energy by this electric field to form a plasma state of ions or radicals that give influences to the plasma doping process.

Moreover, a high-frequency power supply 4 is connected to the lower electrode 3 so that a desired voltage can be generated on the lower electrode 3, and the voltage generated on the lower electrode 3 has a negative electric potential relative to the plasma.

Furthermore, by applying a voltage by the DC power supply 19 to the electrostatic adsorption electrode 18 placed inside the lower electrode 3 (see FIG. 2 or FIG. 3), the sample 6 is electrostatically adsorbed onto the lower electrode 3, and a helium gas, serving as one example of the substrate-cooling gas, is supplied between the sample 6 and the lower electrode 3. As the system for supplying a helium gas between the sample 6 and the lower electrode 3, a closed loop controlling system shown in FIG. 2 and an open loop controlling system shown in FIG. 3 have been known.

Figure 2:
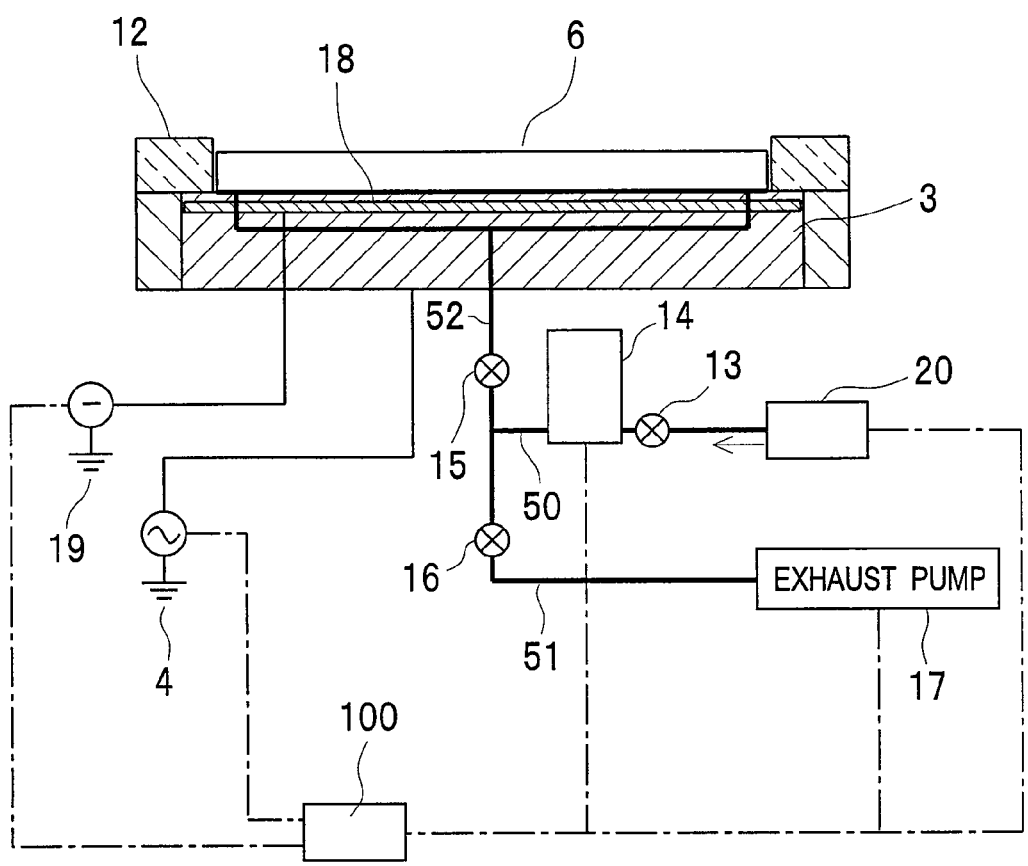
FIG. 2 is a view that shows a lower electrode and a helium pipe having a closed loop structure, used for supplying helium gas between a sample and the lower electrode in the plasma doping processing device of FIG. 1A.

First, in the closed loop controlling system in FIG. 2, the helium gas serving as one example of the substrate-cooling gas is supplied by a helium gas supply device 20, allowed to pass through a substrate-cooling gas supply pipe 50, and enters a substrate-cooling gas pressure-adjusting and flow-rate controlling unit 14 serving as one example of a flow-rate measuring device (leakage amount measuring device) through a valve 13. The substrate-cooling helium gas pressure-adjusting and flow-rate controlling unit 14, while carrying out a pressure adjustment and a flow-rate controlling operation on the substrate-cooling helium gas, supplies the helium gas between the sample 6 and the lower electrode 3, through a valve 15 of a substrate-cooling gas supply/exhaust pipe 52. At this time, a valve 16 arranged on the exhaust pipe 51 connected to the exhaust pump 17 is kept in a closed state. In contrast, when the supplied helium gas is discharged by the exhaust pump 17, the valve 13 is kept in a closed state, while the valve 15 and the valve 16 are kept in an open state.

Figure 3:
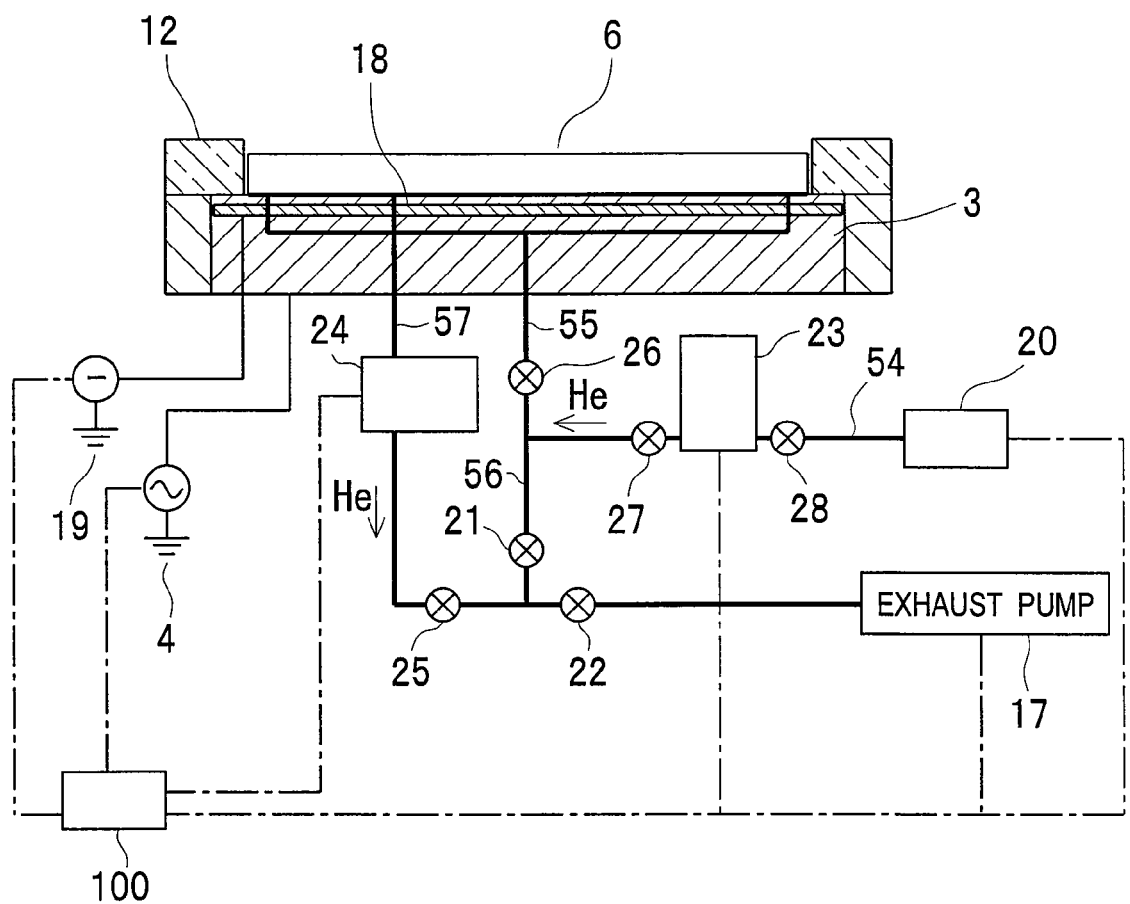
FIG. 3 is a view that shows a lower electrode and a helium pipe having an open loop structure, used for supplying helium gas between a sample and the lower electrode in the plasma doping processing device of FIG. 1A.

Here, in the open loop controlling system in FIG. 3, the substrate cooling helium gas is supplied by the helium gas supply device 20, allowed to pass through the substrate-cooling gas supply pipe 54, and enters a substrate-cooling gas flow-rate controlling unit 23 through a valve 28. In the substrate-cooling gas flow-rate controlling unit 23, the substrate cooling helium gas is allowed to pass through a valve 27 of the substrate-cooling gas supply pipe 54, and further pass through a valve 26 of the substrate-cooling gas supply/exhaust pipe 55, while being controlled in the flow rate of the substrate cooling helium gas, and is supplied between the sample 6 and the lower electrode 3. At this time, a valve 21 arranged on an exhaust pipe 56 connected to the exhaust pump 17 is in a closed state. In contrast, the supplied helium gas is allowed to pass through the exhaust pipe 57, and enters a substrate-cooling gas pressure-adjusting and flow-rate controlling unit 24. The substrate-cooling helium gas pressure-adjusting and flow-rate controlling unit 24, while carrying out a pressure adjustment and a flow-rate controlling operation on the substrate-cooling helium gas to be discharged from the exhaust pipe 57, discharges the helium gas by the exhaust pump 17 through valves 25 and 22 of the exhaust pipe 57. At this time, the valve 21 is in an open state. Here, in this system, the substrate-cooling gas flow-rate controlling unit 23, the substrate-cooling gas pressure-adjusting and flow-rate controlling unit 24, and a calculation function (calculation unit 100a of the control device 100, which will be described later) of the control device 100 constitute one example of the flow-rate measuring device (leakage amount measuring device).

Figure 1B:
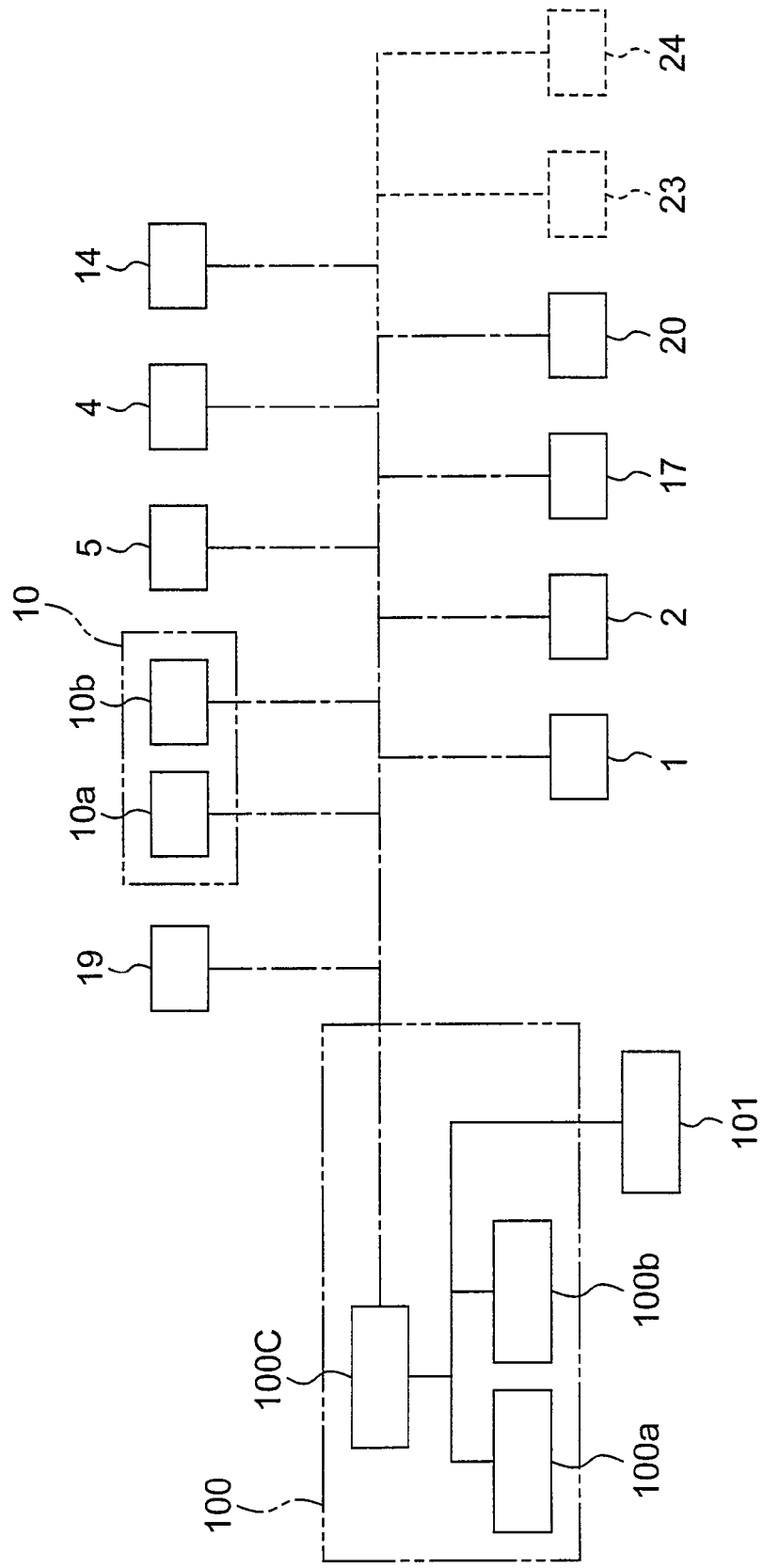
FIG. 1B is a block view that shows a structure of a control device and the like of the plasma doping processing device in accordance with the embodiment of the present invention.

Here, the control device 100, which controls operations of the plasma doping process, is connected to the high-frequency power supply 4, the gas-exhausting device 1, the gas supply device 10, the DC power supply 19, the high-frequency power supply 5, the exhaust pump 17, and the helium gas supply device 20 so that the control device 100 controls the respective operations. In the closed loop control system shown in FIG. 2, the control device 100 is also connected to a substrate-cooling helium gas pressure-adjusting and flow-rate controlling unit 14. Whereas in the open loop control system shown in FIG. 3, the control device 100 is also connected to the substrate-cooling gas flow-rate controlling unit 23 and the substrate-cooling helium gas pressure-adjusting and flow-rate controlling unit 24, so that the control device 100 controls the respective operations. For example, as shown in FIG. 1B, the control device 100 is provided with the control unit 100c for carrying out the above-mentioned controlling operations, the calculation unit 100a controlled by the control unit 100c, and a determination unit 100b controlled by the control unit 100c. A storage unit 101 for storing information and data required for operation-controls of the plasma doping process is further connected to the control device 100. Moreover, when the substrate-cooling gas flow-rate controlling unit 23 and the substrate-cooling helium gas pressure-adjusting and flow-rate controlling unit 24 are connected to the control device 100 in the open loop control system of FIG. 3, the control device 100 has a built-in calculation function for calculating a difference in flow rates of outputted flows of the substrate-cooling gas flow-rate controlling unit 23 and the substrate-cooling helium gas pressure-adjusting and flow-rate controlling unit 24, and based upon the results of the calculations, can control the substrate-cooling gas flow-rate controlling unit 23 or the substrate-cooling helium gas pressure-adjusting and flow-rate controlling unit 24. This control device 100, which will be discussed later in detail, controls the plasma doping gas supply device 10 so as to reduce the supply amount of the diluting gas in accordance with the flow rate (leakage amount) measured by the flow-rate measuring device (for example, if the leakage amount is much, reduces the supply amount of the diluting gas by the corresponding amount thereof), or controls the high-frequency power supply 4, the gas exhausting device 1, the plasma doping gas supply device 10, the DC power supply 19, the helium gas supply device 20, and the like so as to prolong the plasma doping processing time in accordance with the flow rate (leakage amount) measured by the flow-rate measuring device (for example, if the leakage amount is much, prolongs the plasma doping processing time by the corresponding amount thereof).

In the plasma doping processing device having the structure as described above, a plasma doping material gas, supplied into the vacuum container 11 through the gas supply inlet 9, for example, $B_2H_6$, is formed into a plasma state by an electric field generated by the coil 8 to which a high-frequency power is applied so that boron ions in the plasma are introduced onto the surface of the sample 6 by a voltage having a negative potential relative to the plasma generated on the lower electrode 3 by the high-frequency power supply 4.

After a metal wiring layer is formed on the sample 6 to which the impurity is thus introduced, a thin oxide film is formed on the metal wiring layer in a predetermined oxide film atmosphere, and a gate electrode is then formed on the sample 6 by using a CVD device or the like so that, for example, an MOS transistor can be obtained.

In general, in the plasma doping processing device, the amount of introduction of the impurity onto the surface of the sample 6 is controlled by the processing time of the plasma doping and the mass concentration of the impurity. Here, even in the case where it has been determined that there is no leakage of helium gas into the vacuum container 111 under control of the conventional control device 140 based upon the threshold value, if a helium gas, the amount of which is the threshold value or less, is leaking into the vacuum container 111, the concentration of the impurity to be introduced onto the surface of the sample 106 in plasma is lowered, with the result that the amount of introduced impurity onto the surface of the sample 106 per unit time is reduced. Therefore, it is not possible to introduce a desired amount of the impurity onto the sample 106 within a desired period of time, causing the sample 106 to become a defective product, and consequently to lower the yield. This becomes an issue.

The present inventors have found this issue is caused by the following reasons. The following description will discuss these findings.

In comparison with plasma processing devices having the same helium gas supply systems, for example, between an etching processing device and a plasma doping processing device, the following description will discuss a difference in sizes of influences of helium-gas leakage into the vacuum container 11.

In the etching processing device, a gas supplied into the vacuum container 11 is formed into a plasma state so that many plasma particles (ions and radicals) are generated. This arrangement is made because silicon or a material other than silicon is film-formed on a substrate by using a CVD method or a PVD method, and because a patterning process is carried out thereon so that a large amount of portions, not protected by the pattern, needs to be removed by using an etching process. In contrast, in the plasma doping process, the impurity has to be introduced onto the surface of the sample 106 without causing virtually any changes on the patterned shape. For this reason, the number of particles (ions and radicals) in the plasma should be made smaller to a different order of magnitude in comparison with that in the etching process.

Therefore, even in the case where, upon leakage of a small amount of helium gas into the vacuum container 111, no influences are given to the etching process, since the number of particles (ions and radicals) in the plasma devoting to the plasma doping is very small, the amount of introduction of the impurity to the sample 106 tends to easily fluctuate in the plasma doping.

The following description will discuss means for resolving the above issue.

Under control of the control unit 100c of the control device 100, with respect to measurements of the amount of leaking helium gas into the vacuum container 11, the closed loop control system in FIG. 2 carries out the measurements by using the substrate-cooling gas pressure-adjusting and flow-rate controlling unit 14, while the open loop control system in FIG. 3 carries out the measurements by using the two units, that is, the substrate-cooling gas flow-rate controlling unit 23 and the substrate-cooling gas pressure-adjusting and flow-rate controlling unit 24, and based upon the measured results, the determination unit 100b of the control device 100 is allowed to carry out a determination as to whether or not there is any leakage of helium gas into the vacuum container 11. The following description will discuss this in detail.

First, the measurements of the amount of leaking helium gas into the vacuum container 11 in the closed loop control system of FIG. 2 will be described.

A helium gas is supplied by the helium gas supply device 20 through the supply pipe 50, and allowed to enter the substrate-cooling gas pressure-adjusting and flow-rate controlling unit 14 through the valve 13. This helium gas is adjusted in its pressure by the substrate-cooling gas pressure-adjusting and flow-rate controlling unit 14 to a predetermined pressure, that is, to a reference pressure for a substrate-cooling gas, and is then supplied to a space between the sample 6 and the lower electrode 3 through the pipes 50 and 52 and the valve 15. At this time, the valve 16 is kept in a closed state. In this case, the helium gas, thus supplied, has no place to be discharged to.

Therefore, in the case where no leakage of the helium gas supplied into the space between the sample 6 and the lower electrode 3 occurs in the vacuum container 11, the helium gas is maintained at the reference pressure for a substrate-cooling gas so that the supply flow rate of the helium gas, measured by the substrate-cooling gas pressure-adjusting and flow-rate controlling unit 14, becomes virtually 0 $cm^3$/min.

In contrast, in the case where a leakage of the helium gas occurs from the space between the sample 6 and the lower electrode 3 into the vacuum container 11, since the supplied helium gas becomes insufficient in the space between the sample 6 and the lower electrode 3, the lowering of the pressure (reference pressure) of the helium gas is detected by the substrate-cooling gas pressure-adjusting and flow-rate controlling unit 14. In order to return the lowered pressure to the pressure (reference pressure) prior to the lowering, a supply of helium gas is required from the substrate-cooling gas pressure-adjusting and flow-rate controlling unit 14. For example, supposing that, the helium gas having a flow rate corresponding to 2.0 $cm^3$/min is always supplied from the substrate-cooling gas pressure-adjusting and flow-rate controlling unit 14, it is determined that helium gas having a flow rate of about 2.0 $cm^3$/min is leaking into the vacuum container 11. In this manner, the amount of leaking helium gas into the vacuum container 11 (leakage amount) is measured. In other words, in the substrate-cooling gas pressure-adjusting and flow-rate controlling unit 14, the flow rate and the pressure of the substrate-cooling helium gas to be supplied to the space between the sample 6 and the lower electrode 3 are preliminarily measured, and in the case where a predetermined pressure is not maintained, the flow rate that can sufficiently maintain the predetermined pressure is supplied to the space between the sample 6 and the lower electrode 3. Measuring the flow rate at this time, it means measuring the amount of leaking helium gas into the vacuum container 11.

Next, the measurements of the amount of leaking helium gas into the vacuum container 11 in the open loop control system of FIG. 3 will be described.

A helium gas is supplied by the helium gas supply device 20 through the supply pipe 54, and allowed to enter the substrate-cooling gas flow-rate controlling unit 23 through the valve 28. This helium gas is adjusted in its flow rate by the substrate-cooling gas flow-rate controlling unit 23 to a predetermined flow rate, for example, to A cm$^3$/min, and is then supplied to the space between the sample 6 and the lower electrode 3 through the pipes 54 and 55 and the valves 27 and 26. At this time, the valve 21 is kept in a closed state. The helium gas, supplied into the space between the sample 6 and the lower electrode 3, is allowed to pass through the space between the sample 6 and the lower electrode 3, and enters the substrate-cooling gas pressure-adjusting and flow-rate controlling unit 24. The pressure of the helium gas thus supplied is adjusted to a predetermined pressure by the substrate-cooling gas pressure-adjusting and flow-rate controlling unit 24. In order to adjust the pressure of the helium gas to a predetermined pressure, an excessive portion of the helium gas needs to be discharged to the exhaust pump 17 through the exhaust pipe 57 and the valves 25 and 22. At this time, the valve 21 is kept in a closed state. In the case where no leakage of the helium gas supplied into the space between the sample 6 and the lower electrode 3 occurs from the space between the sample 6 and the lower electrode 3 into the vacuum container 11, the flow rate of the helium gas measured by the substrate-cooling gas pressure-adjusting and flow-rate controlling unit 24 is set to virtually the same as the flow rate of the helium gas supplied by the substrate-cooling gas flow-rate controlling unit 23.

In contrast, in the case where a leakage of the helium gas occurs from the space between the sample 6 and the lower electrode 3 into the vacuum container 11, since the supplied helium gas becomes insufficient, the lowering of the pressure occurs. In order to return the lowered pressure to the pressure prior to the lowering, the amount of the excessive portion of the helium gas that has been discharged by the substrate-cooling gas pressure-adjusting and flow-rate controlling unit 24 needs to be adjusted. For example, supposing that helium gas having a flow rate corresponding to A=10.0 cm$^3$/min is supplied by the substrate-cooling gas flow-rate controlling unit 23, in the case where helium gas having a flow rate corresponding to 2.0 cm$^3$/min is leaking from the space between the sample 6 and the lower electrode 3 into the vacuum container 11, a flow rate corresponding to 8.0 cm$^3$/min is measured by the substrate-cooling gas pressure-adjusting and flow-rate controlling unit 24. Therefore, the difference between the flow rate of helium gas that is supplied by the substrate-cooling gas flow-rate controlling unit 23 and the flow rate of helium gas measured by the substrate-cooling gas pressure-adjusting and flow-rate controlling unit 24 corresponds to an amount of leaking helium gas into the vacuum container 11. This difference is found by utilizing the calculation function of the control device 100 to which the flow rate information from the substrate-cooling gas flow-rate controlling unit 23 and the substrate-cooling gas pressure-adjusting and flow-rate controlling unit 24 are inputted (for example, found by calculation s in the calculation unit 100a of the control device 100). In this manner, the measurements of the amount of leaking helium gas into the vacuum container 11 are carried out by the substrate-cooling gas flow-rate controlling unit 23, the substrate-cooling gas pressure-adjusting and flow-rate controlling unit 24, and the calculation functions (calculation unit 100a of control device 100) of the control device 100.

Here, with respect to the relationship between the amount of introduction of the impurity to the sample 6 and the sheet resistance, in the case where a large amount of impurities is introduced onto the surface of the sample 6, the sheet resistance value of the sample 6 becomes lower, while, in the case where only a small amount of impurities is introduced thereto, the sheet resistance value becomes higher; that is, there is an inversely proportional relationship. Hereinafter, with respect to the amount of introduction of the impurity to the sample 6, the relationship is described by using only the sheet resistance.

Originally, the amount of introduction of the impurity to the sample 6 is represented by "dose amount".

Figure 17:
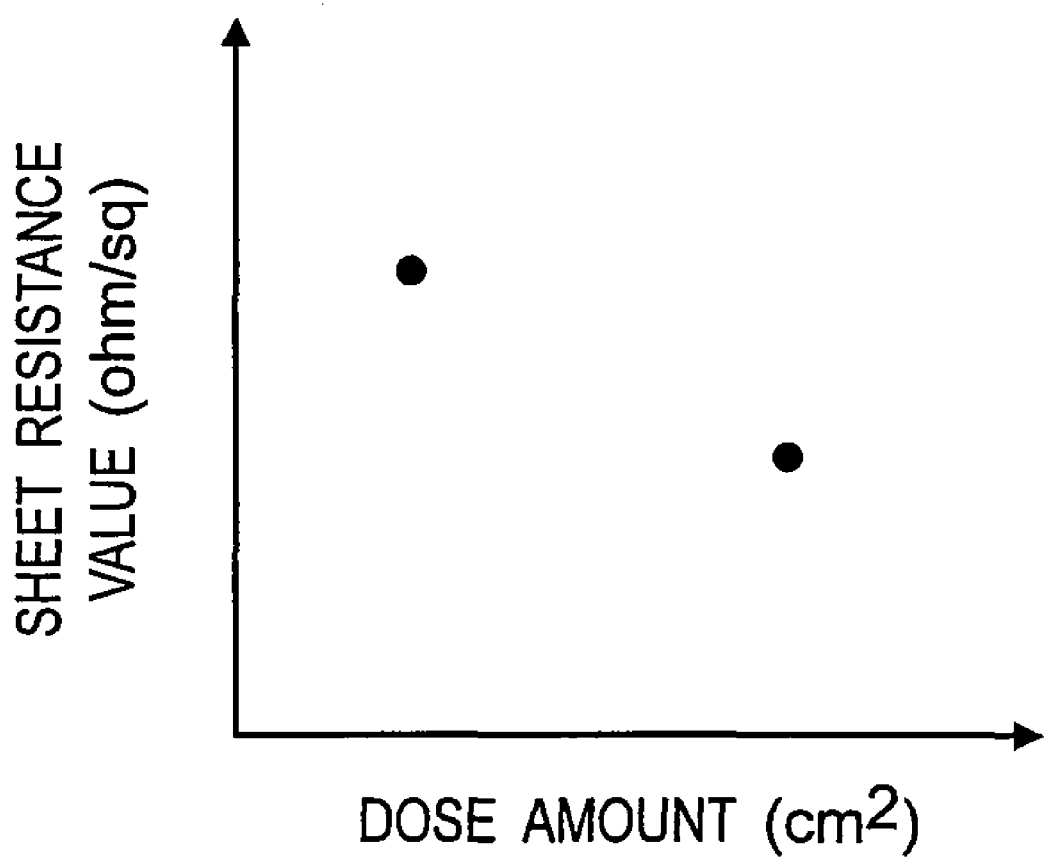
FIG. 17 is a view that shows a relationship between a sheet resistance and an amount of dose of a conventionally known sample.

Here, the dose amount corresponds to an amount of a desired impurity element introduced onto the sample substrate by a plasma doping process. FIG. 17 is a graph that shows the relationship between the sheet resistance and the dose amount of a sample that was subjected to the same known thermal process. As shown in FIG. 17, when sheet resistances having a large amount of dose amount and having a relatively small amount of dose amount are compared with each other, the resulting relationship shows that a sample having a large amount of dose amount has a smaller sheet resistance than that of a sample having a small amount of dose amount.

As shown in FIG. 17, between the sheet resistance and the dose amount, there is the relationship that as the sheet resistance increases, the dose amount reduces. Therefore, "obtaining a desired sheet resistance", in other words, corresponds to "obtaining a desired dose amount."

The desired dose amount can be obtained by setting a plasma doping time relative to the amount that can be introduced to the sample substrate per unit time. Therefore, supposing that a desired dose amount is D, an amount of the impurity element that can be introduced to the sample substrate per unit time is A cm$^2 \cdot$sec$^{-1}$, and a plasma doping time is Tsec, a relationship, D=A×T, holds.

For example, in an attempt to obtain a desired dose amount $D_1$ (=$A_1 \times T_1$), when the amount $A_1$ of the impurity element that can be introduced to the sample substrate per unit time is reduced by ΔA to become $A_2$ (=$A_1$−ΔA), the plasma doping time $T_1$ is increased by ΔT to be set to $T_2$ (=$T_1$+ΔT) so that a desired dose amount $D_1$ (=$A_2 \times T_2$) can be obtained.

Here, the amount A of the impurity element that can be introduced to the sample substrate per unit time is reduced by reducing the doping material gas concentration in the vacuum container; in contrast, it is increased by increasing the doping material gas concentration.

Moreover, in the case where the setting of the plasma doping time T is not changed, it becomes possible to obtain a desired dose amount D by keeping A of the impurity element that can be introduced into the sample substrate per unit time at a constant value. In the case where a cooling gas is leaked into the vacuum container, the amount A of the impurity element that can be introduced into the sample substrate per unit time can be maintained at a constant value by reducing the amount of supply of the diluting gas.

Since measuring the sheet resistance is easier than measuring the dose amount, the present application will discuss the present invention by using the sheet resistance.

Figure 5:
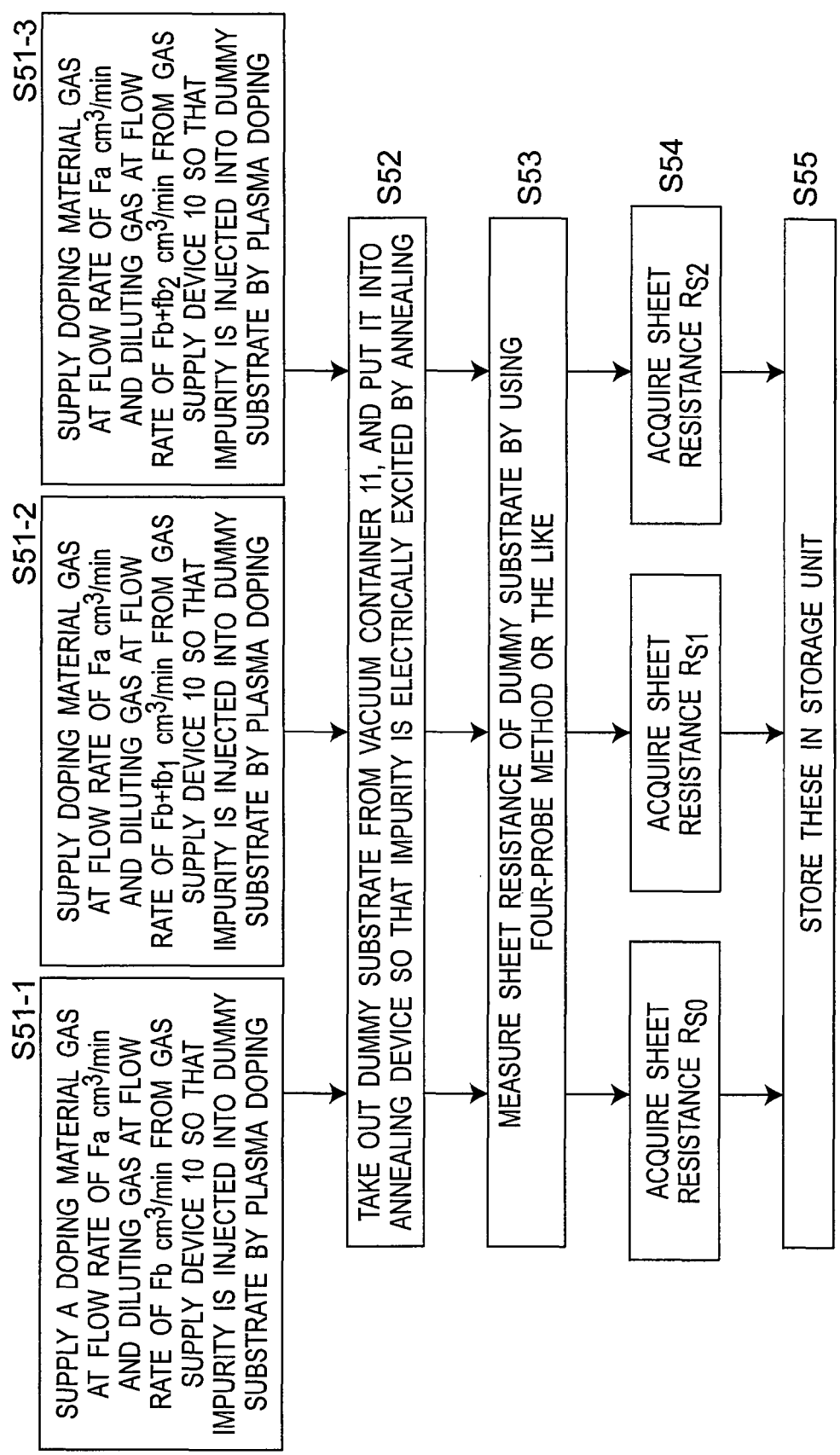
FIG. 5 is a flow chart that shows processes for acquiring relationship information between different flow rates of diluting helium gas and sheet resistances in the plasma doping processing device in accordance with the embodiment of the present invention.

First, prior to carrying out a plasma doping process on a substrate to be processed, data of the relationship (relationship data) between a flow rate of helium gas serving as one example of a diluting gas or a concentration of an impurity and a sheet resistance, and data of the relationship (relationship data) between a plasma doping time and a sheet resistance are preliminarily acquired, and stored in the storage unit 101. FIG. 5 shows a flow chart of processes for acquiring the relationship information between different flow rates of diluting helium gas and sheet resistances.

(Step S51-1)

After a first dummy substrate having the same size and material as those of a substrate to be subjected to the plasma doping process is transported into the vacuum container 11, a doping material gas having a flow rate corresponding to Fa cm$^3$/min and a diluting gas having a flow rate corresponding to Fb cm$^3$/min are supplied from the gas supply device 10 to the vacuum container 11, and a plasma doping process is then carried out so that the impurity is introduced onto the first dummy substrate. For example, the flow rate Fa cm$^3$/min of the doping material gas is set to 15 cm$^3$/min, and, for example, the flow rate Fb cm$^3$/min of the diluting gas is set to 35 cm$^3$/min.

(Step S51-2)

After, in place of the first dummy substrate, another dummy substrate (second dummy substrate) having the same size and material as those of a substrate to be subjected to the plasma doping process is transported into the vacuum container 11, a doping material gas having a flow rate corresponding to Fa cm$^3$/min and a diluting gas having a flow rate corresponding to (Fb+fb$_1$) cm$^3$/min are supplied from the gas supply device 10 to the vacuum container 11, and a plasma doping process is then carried out so that the impurity is introduced onto the second dummy substrate. The concentration of the plasma doping gas is lower than that of step S51-1. Here, for example, fb$_1$ cm$^3$/min of the flow rate is set to 1.0 cm$^3$/min.

(Step S51-3)

After, in place of the second dummy substrate, still another dummy substrate (third dummy substrate) having the same size and material as those of a substrate to be subjected to the plasma doping process is transported into the vacuum container 11, a doping material gas having a flow rate corresponding to Fa cm$^3$/min and a diluting gas having a flow rate corresponding to (Fb+fb$_2$) cm$^3$/min are supplied from the gas supply device 10 to the vacuum container 11, and a plasma doping process is then carried out so that the impurity is introduced onto the third dummy substrate. The present flow chart shows a case where the flow rate fb$_2$ of the diluting gas to be supplied is made greater than the previous flow rate fb$_1$ of the diluting gas, with the concentration of the plasma doping gas being made further lower than that of step S51-2.

Here, as described in steps S51-1 to S51-3, the present flow chart acquires data of three kinds of plasma doping gas concentrations; however, even data of three kinds or more may be acquired without causing any problems, and the more the kinds of data, the better. Here, for example, fb$_2$ cm$^3$/min of the flow rate is set to 5 cm$^3$/min.

(Step S52)

Next, under control of the control unit 100c of the control device 100, each of the dummy substrates is taken out of the vacuum container 11 by using a known method or the like, not shown, and the dummy substrate is loaded into an annealing device, not shown, so that the impurity of each of the dummy substrates is electrically excited by an annealing process.

(Step S53)

Figure 6:
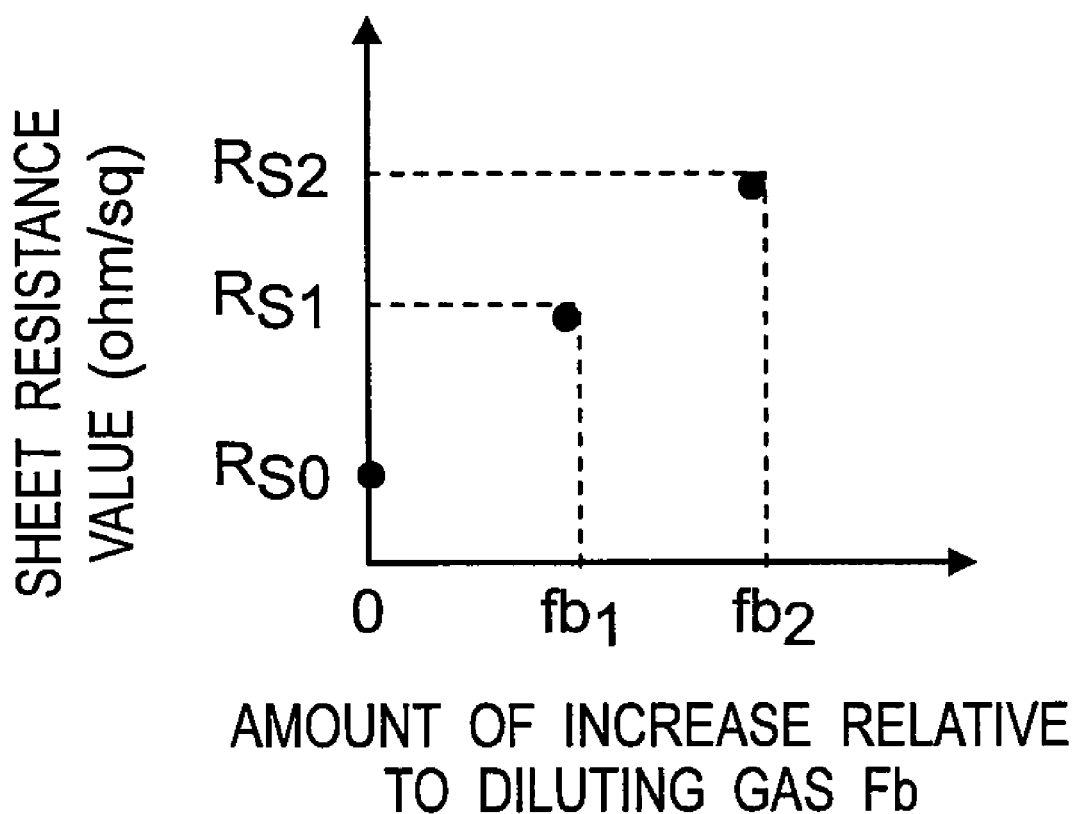
FIG. 6 is a graph that shows processes for acquiring relationship information between an increased amount of a helium gas and a sheet resistance relative to a desired flow rate of diluting helium gas in the plasma doping processing device in accordance with the embodiment of the present invention.

Next, the sheet resistance of each of the dummy substrates is measured by using a four-probe method or the like, and the information of the sheet resistance and the information relating to the flow rate of the diluting gas or the impurity-gas concentration are stored in the storage unit 101. FIG. 6 shows one example of information to be thus stored in the storage unit 101. FIG. 6 is a graph that shows relationship information between the amount of an increase in helium gas relative to a desired flow rate of diluting helium gas and the sheet resistance. In step S51-1, the sheet resistance corresponds to R$_{S0}$ at the flow rate of diluting gas of Fb cm$^3$/min, in step S51-2, the sheet resistance corresponds to R$_{S1}$ when the flow rate of diluting gas is increased by fb$_1$ cm$^3$/min relative to the flow rate of diluting gas of Fb cm$^3$/min, and in step S51-3, the sheet resistance corresponds to R$_{S2}$ when the flow rate of diluting gas is increased by fb$_2$ cm$^3$/min relative to the flow rate of diluting gas of Fb cm$^3$/min. Therefore, it is found that as the diluting gas flow rate increases, the sheet resistance increases (in other words, the amount of introduction of the impurity reduces). Here, for example, the sheet resistance R$_{S1}$ is set to (R$_{S0}$×0.95) ohm/sq. based upon sheet resistance R$_{S0}$, for example, the sheet resistance R$_{S2}$ is set to (R$_{S0}$×0.90) ohm/sq. based upon sheet resistance R$_{S0}$, and, for example, the sheet resistance R$_{S0}$ is set to 250 ohm/sq.

Figure 7:
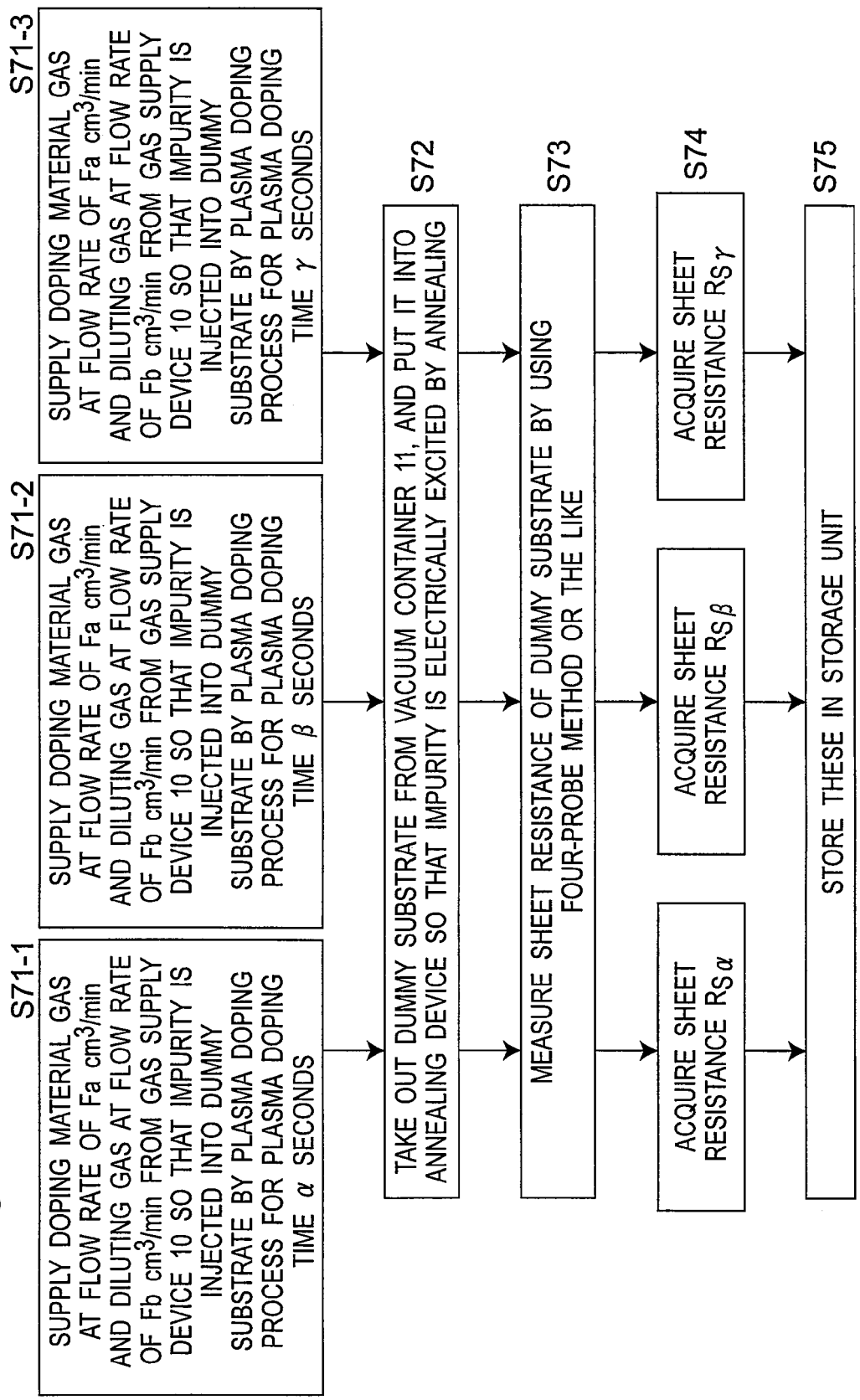
FIG. 7 is a flow chart that shows processes for acquiring relationship information between a plasma doping time and a sheet resistance in the plasma doping processing device in accordance with the embodiment of the present invention.

Moreover, prior to carrying out a plasma doping process on a substrate to be processed, relationship information between a plasma doping time and a sheet resistance is preliminarily acquired, and stored in the storage unit 101. FIG. 7 shows a flow chart of processes for acquiring the relationship information between the plasma doping time and the sheet resistance.

(Step S71-1)

After a fourth dummy substrate having the same size and material as those of a substrate to be subjected to the plasma doping process is transported into the vacuum container 11, a doping material gas having a flow rate corresponding to Fa cm$^3$/min and a diluting gas having a flow rate corresponding to Fb cm$^3$/min are supplied from the gas supply device 10 to the vacuum container 11, and a plasma doping process is then carried out for a plasma doping time, α seconds (0<α), so that the impurity is introduced onto the fourth dummy substrate. For example, the plasma doping time α (seconds) is set to 60 seconds.

(Step S71-2)

After yet another dummy substrate (fifth dummy substrate) having the same size and material as those of a substrate to be subjected to the plasma doping process is transported into the vacuum container 11, in place of the fourth dummy substrate, a doping material gas having a flow rate corresponding to Fa cm$^3$/min and a diluting gas having a flow rate corresponding to Fb cm$^3$/min are supplied from the gas supply device 10 to the vacuum container 11, and a plasma doping process is then carried for a plasma doping time, β seconds, so that the impurity is introduced onto the fifth dummy substrate. The present flow chart shows a case where the time β is longer than the time α (that is, 0<α<β). For example, the plasma doping time β (seconds) is set to 65 seconds.

(Step S71-3)

After yet another dummy substrate (sixth dummy substrate) having the same size and material as those of a substrate to be subjected to the plasma doping process is transported into the vacuum container 11, in place of the fifth dummy substrate, a doping material gas having a flow rate corresponding to Fa cm$^3$/min and a diluting gas having a flow rate corresponding to Fb cm$^3$/min are supplied from the gas supply device 10 to the vacuum container 11, and a plasma doping process is then carried for a plasma doping time, γ seconds, so that the impurity is introduced onto the sixth dummy substrate. The present flow chart shows a case where the time γ is further longer than the time β (that is, 0<α<β<γ). For example, the plasma doping time γ is set to 70 seconds.

Here, as described in steps S71-1 to S71-3, the present flow chart acquires data of three kinds of plasma doping periods of time; however, even data of three kinds or more may be acquired without causing any problems, and the more the kinds of data, the better.

(Step S72)

Next, under control of the control unit 100c of the control device 100, each of the dummy substrates is taken out of the vacuum container 11 by using a known method or the like, not shown, and the dummy substrate is loaded into an annealing device, not shown, so that the impurity of each of the dummy substrates is electrically excited by an annealing process.

(Step S73)

Figure 8:
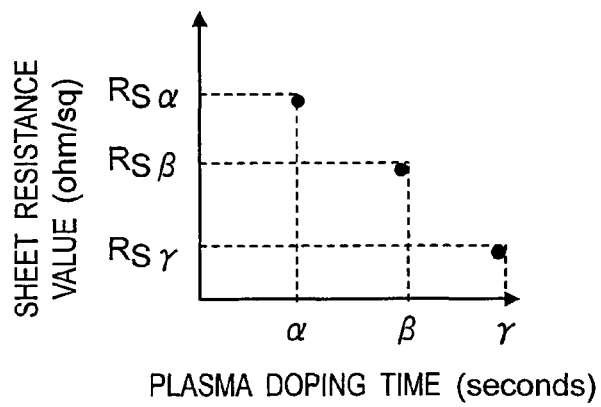
FIG. 8 is a graph that shows the relationship information between a desired plasma doping time and a sheet resistance in the plasma doping processing device in accordance with the embodiment of the present invention.

Next, the sheet resistance of each of the dummy substrates is measured by using a four-probe method or the like, and the information of the sheet resistance and the information relating to the plasma doping time are stored in the storage unit 101. FIG. 8 shows one example of information to be thus stored in the storage unit 101. FIG. 8 is a graph that shows relationship information between a desired plasma doping time and the sheet resistance. In step S71-1, the sheet resistance corresponds to $R_{Sα}$ at the plasma doping time of α seconds, and in step S51-2, the sheet resistance corresponds to $R_{Sβ}$ at the plasma doping time of β seconds, while in step S51-3, the sheet resistance corresponds to $R_{Sγ}$ at the plasma doping time of γ seconds. Therefore, it is found that as the plasma doping time increases, the sheet resistance reduces (in other words, the amount of introduction of the impurity increases). Here, for example, the sheet resistance $R_{Sβ}$ is set to ($R_{Sα}$×1.05) ohm/sq. based upon sheet resistance $R_{Sα}$, and, for example, the sheet resistance $R_{Sγ}$ is set to ($R_{Sα}$×1.10) ohm/sq. based upon sheet resistance $R_{Sα}$. For example, the sheet resistance $R_{Sα}$ is set to 250 ohm/sq.

Figure 13:
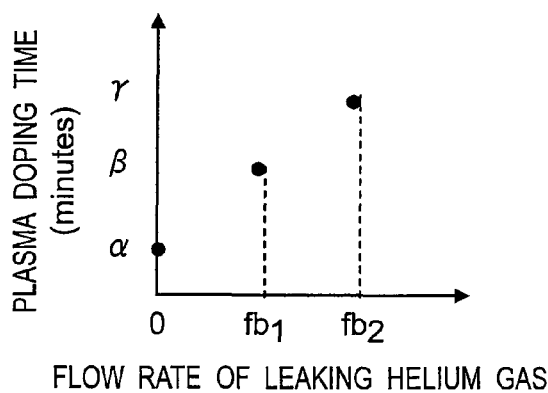
FIG. 13 is a graph that shows relationship information between an amount of leaking helium gas and a plasma doping time in the plasma doping processing device in accordance with the embodiment of the present invention.
Figure 14:
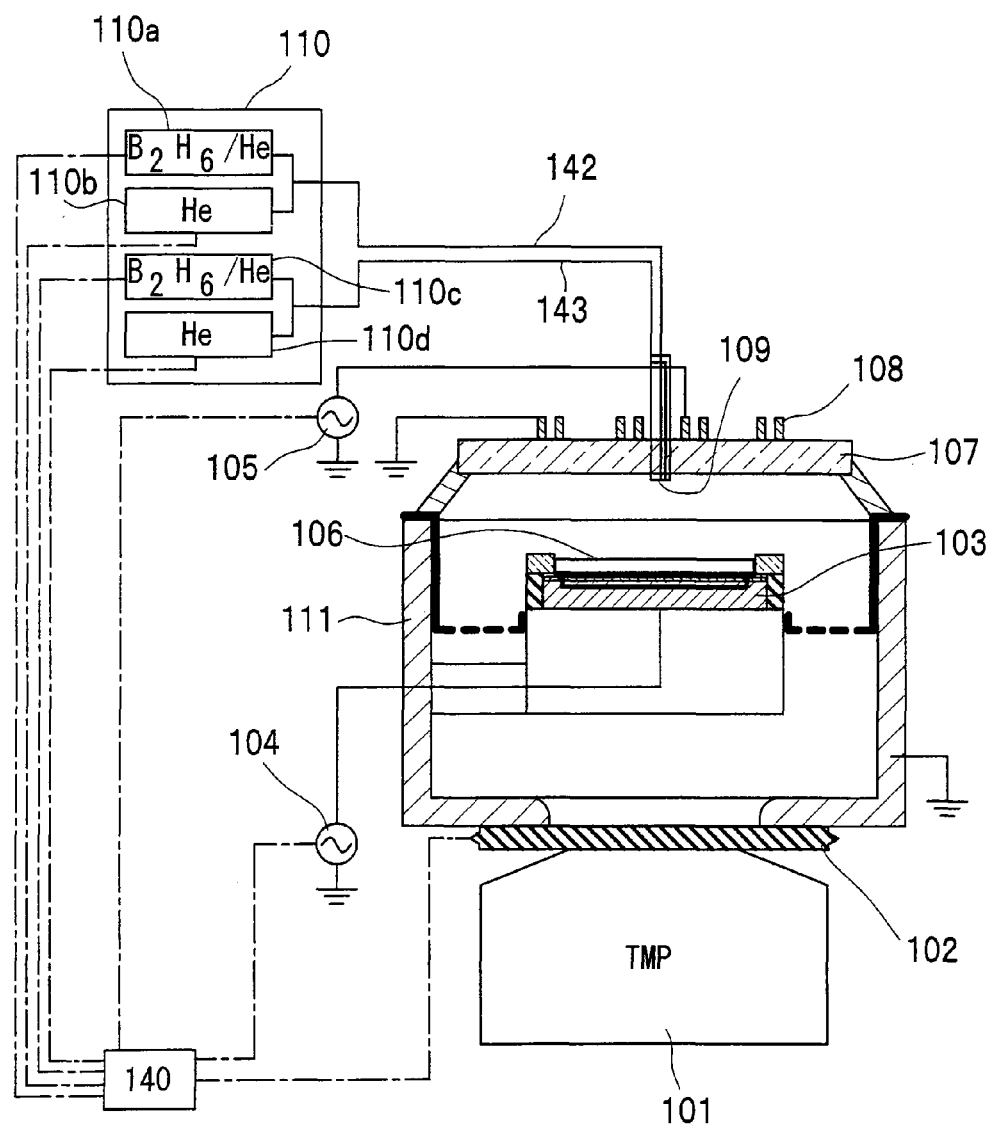
FIG. 14 is a schematic view that shows a structure of a conventional plasma processing device.
Figure 15:
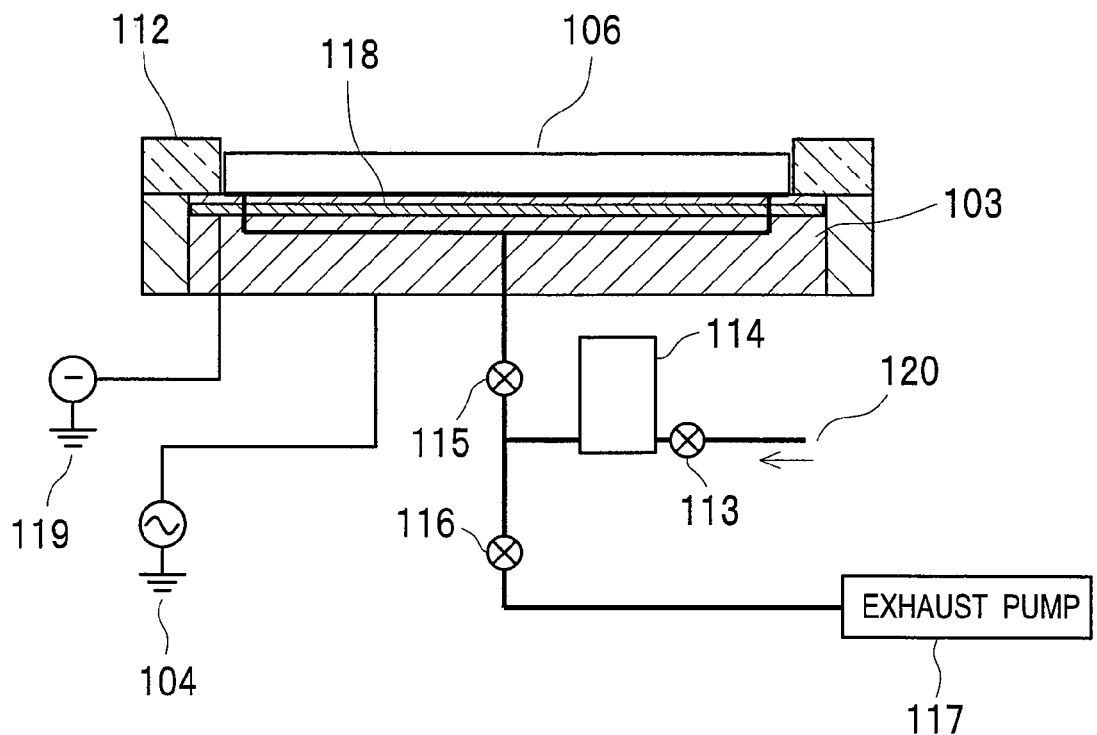
FIG. 15 a view that shows a lower electrode and a helium pipe having a closed loop structure, used for supplying helium gas between a sample and the lower electrode in the plasma processing device of FIG. 14.
Figure 16:
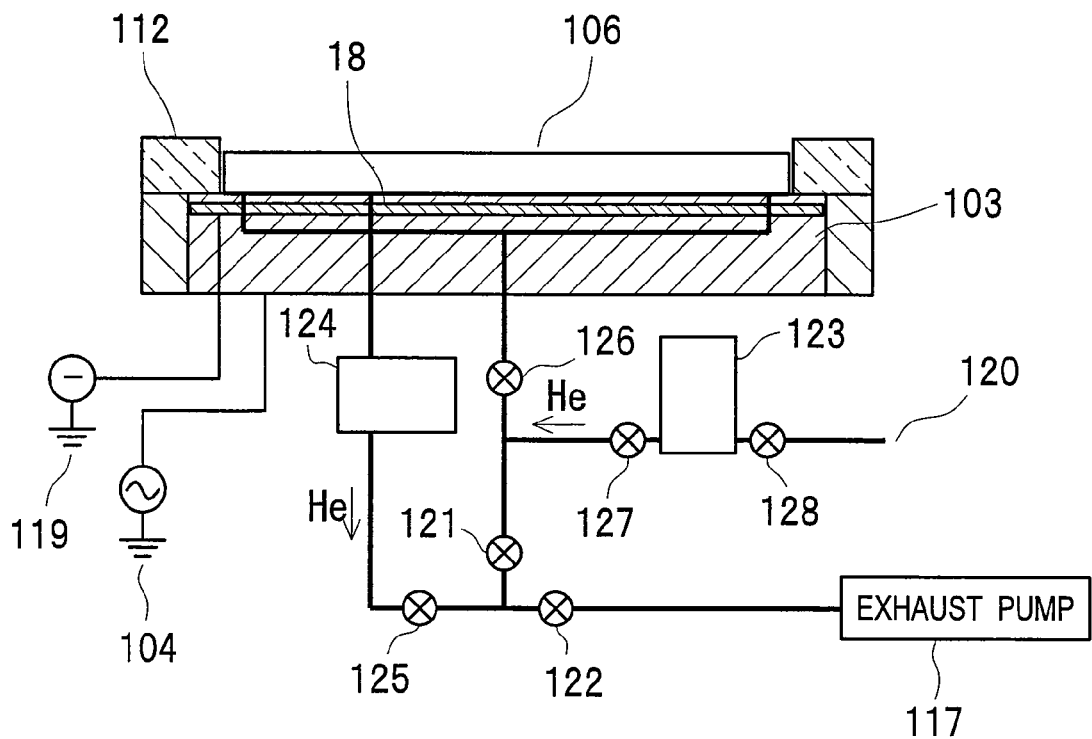
FIG. 16 is a view that shows a lower electrode and a helium pipe having an open loop structure, used for supplying helium gas between a sample and the lower electrode in the plasma processing device of FIG. 14.

Next, upon completion of acquiring data of the relationship information (relationship data) between a flow rate of diluting helium gas or a concentration of an impurity and a sheet resistance, and data of the relationship (relationship data) between a plasma doping time and a sheet resistance, the data of the relationship (relationship data) between a flow rate of diluting helium gas or a concentration of an impurity and a sheet resistance, and data of the relationship (relationship data) between a plasma doping time and a sheet resistance, stored in the storage unit 101, are allowed to have a correlation as shown in FIG. 13. For example, supposing that the gas flow rate required for obtaining a desired sheet resistance in a desired period of time corresponds to a doping material gas flow rate of Fa cm$^3$/min with a diluting gas flow rate being set to Fb cm$^3$/min, it is found that a period of time, required for obtaining a desired sheet resistance in the case where the flow rate of the diluting gas is increased by $fb_1$ cm$^3$/min, corresponds to a period of time obtained by increasing the plasma doping time for introducing a desired impurity to the sample 6 by time (β−α) seconds. Moreover, it is also found that a period of time, required for obtaining a desired sheet resistance in the case where the flow rate of the diluting gas is increased by $fb_2$ cm$^3$/min, corresponds to a period of time obtained by increasing the plasma doping time for introducing a desired impurity to the sample 6 by time (γ−α) seconds. Therefore, in the case where the flow rate of the diluting gas is increased by $fb_1$ cm$^3$/min, that is, for example, 1.0 cm$^3$/min, a period of time, required for obtaining a desired sheet resistance, corresponds to (β−α) seconds, for example, +5 seconds, as the plasma doping time for introducing a desired impurity to the sample 6. In the above-mentioned example, (β−α) seconds=(65−60) seconds=+5 seconds.

Figure 4:
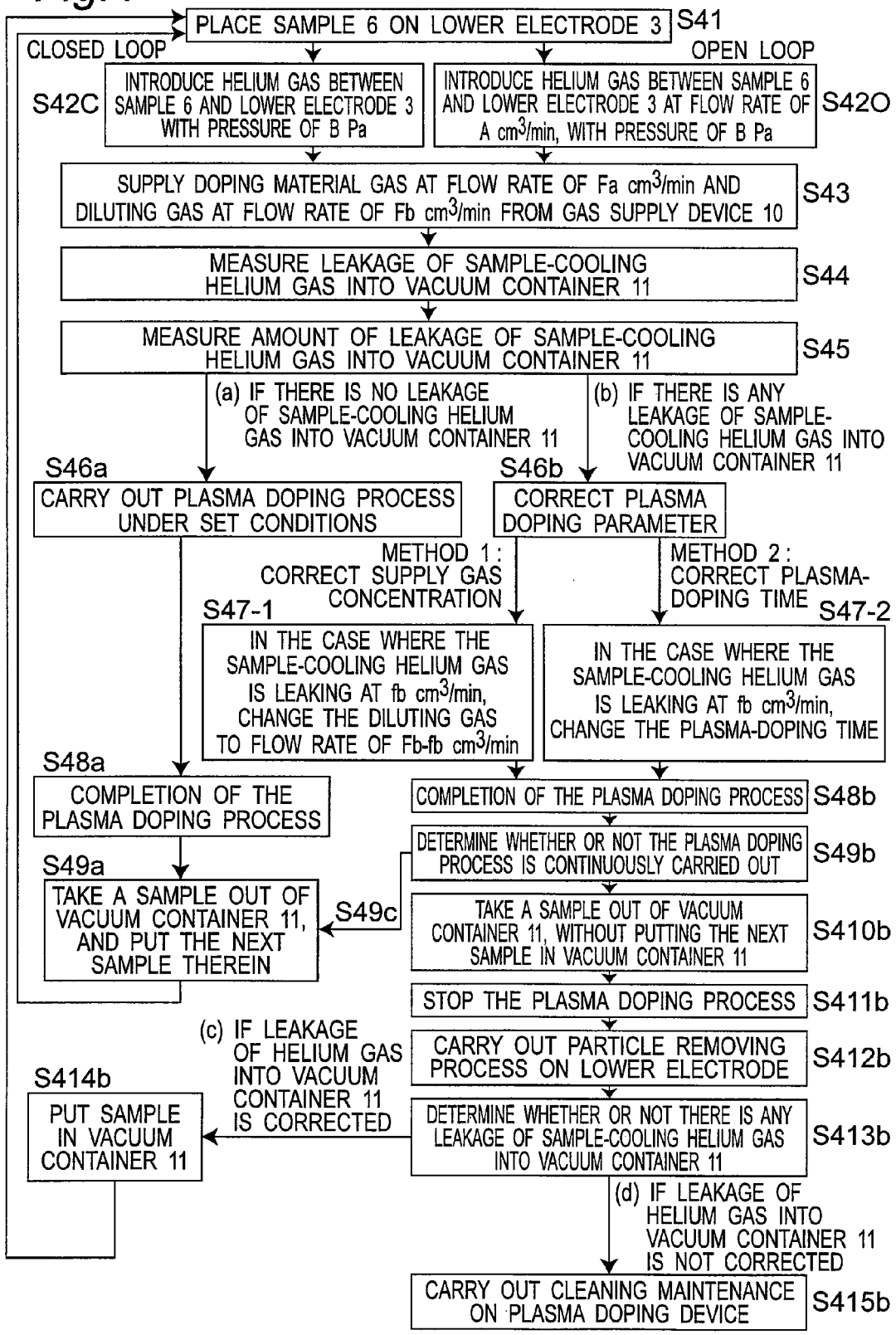
FIG. 4 is a flow chart that shows a helium leakage determining process and a plasma doping parameter correcting process of the plasma doping processing device in accordance with the embodiment of the present invention.

FIG. 4 shows a correction flow chart for plasma doping parameters that is used for resolving the above issues.

(Step S41)

Under control of the control unit 100c of the control device 100, a sample 6 is placed on the lower electrode 3.

(Step S42C or Step S42O)

Next, depending on the system for supplying helium gas between the sample 6 and the lower electrode 3, either step S42C or step S42O is carried out. That is, under control of the control unit 100c of the control device 100, a voltage is supplied to the electrode 18 for electrostatic adsorption placed inside the lower electrode 3 by the DC power supply 19 so that the sample 6 is electrostatically adsorbed onto the lower electrode 3. Thereafter, a substrate-cooling helium gas is supplied between the sample 6 and the lower electrode 3. More specifically, in the case of the closed loop control system as shown in FIG. 2, in step S42C, the substrate-cooling helium gas is supplied between the sample 6 and the lower electrode 3 at a pressure B Pa, after the electrostatic adsorption. In the case of the open loop control system as shown in FIG. 3, after the electrostatic adsorption, in step S42O, the substrate-cooling helium gas is supplied between the sample 6 and the lower electrode 3 at a flow rate A cm$^3$/min with pressure B Pa. For example, the pressure B Pa is set to 600 Pa.

(Step S43)

Under control of the control unit 100c of the control device 100, a doping material gas is supplied at Fa cm$^3$/min by the gas supply device 10, with a diluting gas being supplied at Fb cm$^3$/min; thus, these gases are supplied into the vacuum container 11 through the gas supply inlet 9.

(Step S44)

Next, under control of the control unit 100c of the control device 100, an amount of leaking helium gas into the vacuum container 11 of the helium gas that has been supplied between the sample 6 and the lower electrode 3 is measured.

First, in the aforementioned closed loop controlling system in FIG. 2, the measurement of the amount of leaking helium gas into the vacuum container 11 will be described. The substrate-cooling helium gas is supplied by the helium gas supply device 20, and allowed to enter the substrate-cooling gas pressure-adjusting and flow-rate controlling unit 14 through the valve 13, and the pressure of the helium gas to be supplied between the sample 6 and the lower electrode 3 is adjusted to the substrate cooling gas supply pressure B Pa, and the resulting gas is supplied between the sample 6 and the lower electrode 3 through the valve 15. At this time, the valve 16 is kept in a closed state. In this case, the supplied helium gas has no place to be discharged to. Therefore, in the case where no leakage of the helium gas supplied into the space between the sample 6 and the lower electrode 3 occurs, the supply flow rate of the helium gas, measured by the substrate-cooling gas pressure-adjusting and flow-rate controlling unit 14, becomes virtually 0 cm³/min. Here, in the case where a leakage of the helium gas occurs from the space between the sample 6 and the lower electrode 3 into the vacuum container 11, since the supplied helium gas becomes insufficient, the lowering of the pressure of the helium gas from the substrate cooling gas supply pressure B Pa is detected by the substrate-cooling gas pressure-adjusting and flow-rate controlling unit 14. In order to return the lowered pressure to the substrate cooling gas supply pressure B Pa, helium gas is supplied from the substrate-cooling gas pressure-adjusting and flow-rate controlling unit 14 to the space between the sample 6 and the lower electrode 3. For example, supposing that 2.0 cm³/min of the helium gas is always flowing, it is determined that helium gas having a flow rate of 2.0 cm³/min is leaking into the vacuum container 11. In this manner, the amount of leaking helium gas into the vacuum container 11 is measured by the substrate-cooling gas pressure-adjusting and flow-rate controlling unit 14.

Next, the measurements of the amount of leaking helium gas into the vacuum container 11 in the open loop control system of FIG. 3 will be described. A substrate-cooling helium gas is supplied by the helium gas supply device 20, and allowed to enter the substrate-cooling gas flow-rate controlling unit 23 through the valve 28. The flow rate of the helium gas to be supplied between the sample 6 and the lower electrode 3 is adjusted to a substrate-cooling gas supply flow rate A cm³/min by the substrate-cooling gas flow-rate controlling unit 23, and supplied between the sample 6 and the lower electrode 3 through the valves 27 and 26. The helium gas, thus supplied, is allowed to pass between the sample 6 and the lower electrode 3, and enters the substrate-cooling gas pressure-adjusting and flow-rate controlling unit 24. The pressure of the helium gas thus supplied is adjusted to a substrate-cooling gas supply pressure B Pa by the substrate-cooling gas pressure-adjusting and flow-rate controlling unit 24. In order to adjust the pressure of the helium gas to the substrate-cooling gas supply pressure B Pa, an excessive portion of the helium gas is discharged to the exhaust pump 17 through the valves 25 and 22. At this time, the valve 21 is kept in a closed state. In the case where no leakage of the supplied helium gas occurs from the space between the sample 6 and the lower electrode 3 into the vacuum container 11, the flow rate of the helium gas measured by the substrate-cooling gas pressure-adjusting and flow-rate controlling unit 24 becomes virtually the same as the substrate-cooling gas supply flow rate A cm³/min of the helium gas supplied by the substrate-cooling gas flow-rate controlling unit 23. Here, in the case where a leakage of the helium gas occurs from the space between the sample 6 and the lower electrode 3 into the vacuum container 11, the flow rate is reduced from the substrate-cooling gas supply flow rate A cm³/min with the result that the helium gas becomes insufficient, and the lowering of the pressure from the substrate-cooling gas supply pressure B Pa is detected by the substrate-cooling gas pressure-adjusting and flow-rate controlling unit 24. In order to adjust the pressure of the helium gas to the substrate-cooling gas supply pressure B Pa, the amount of the helium gas corresponding to an excessive portion to be discharged by the substrate-cooling gas pressure-adjusting and flow-rate controlling unit 24 is adjusted. For example, suppose that 10.0 cm³/min of the helium gas is supplied from the substrate-cooling gas flow-rate controlling unit 23. In the case where helium gas having a flow rate of 2.0 cm³/min is leaking from the space between the sample 6 and the lower electrode 3 into the vacuum container 11, a flow rate corresponding to 8.0 cm³/min is measured by the substrate-cooling gas pressure-adjusting and flow-rate controlling unit 24. Therefore, the difference between the flow rate of helium gas that is supplied by the substrate-cooling gas flow-rate controlling unit 23 and the flow rate of helium gas measured by the substrate-cooling gas pressure-adjusting and flow-rate controlling unit 24 corresponds to an amount of leaking helium gas into the vacuum container 11. After flow rate information is inputted from the substrate-cooling gas flow-rate controlling unit 23 and the substrate-cooling gas pressure-adjusting and flow-rate controlling unit 24 to the calculation unit 100a through the control unit 100c of the control device 100, this difference is found by calculations in the calculation unit 100a of the control device 100 based upon the inputted information. In this manner, the measurements of the amount of leaking helium gas into the vacuum container 11 are carried out by the substrate-cooling gas flow-rate controlling unit 23, the substrate-cooling gas pressure-adjusting and flow-rate controlling unit 24, and the calculation unit 100a of the control device 100.

(Step S45)

In step S44, based upon the flow rate of helium gas detected by the substrate-cooling gas pressure-adjusting and flow-rate controlling unit 14 or the difference in flow rates of helium gas found by the calculation unit 100a of the control device 100 based upon the respective measurements made by the substrate-cooling gas flow-rate controlling unit 23 and the substrate-cooling gas pressure-adjusting and flow-rate controlling unit 24, the determination unit 100b of the control device 100 determines whether or not there is any leakage of helium gas into the vacuum container 11. This determination is carried out by the determination unit 100b of the control device 100 by using an error determining threshold value $Th_1$ that is one of two or more threshold values preliminarily stored in the storage unit 101. In this step, the determination unit 100b of the control device 100 determines whether or not the measured flow-rate difference of helium gas is not higher than the error determining threshold value $Th_1$. In the case where the flow rate of helium gas detected by the substrate-cooling gas pressure-adjusting and flow-rate controlling unit 14 or the difference in flow rates of helium gas found by the calculation unit 100a of the control device 100 based upon the respective measurements made by the substrate-cooling gas flow-rate controlling unit 23 and the substrate-cooling gas pressure-adjusting and flow-rate controlling unit 24 is not higher than the error determining threshold value $Th_1$, the determination unit 100b of the control device 100 determines that this state is within the error range and can be negligible. In the case where the detected flow rate or the flow-rate difference exceeds the error determining threshold value $Th_1$, the determination unit 100b of the control device 100 determines that this state exceeds the error range and that the substrate-cooling gas is leaking into the vacuum chamber 11.

Therefore, after step S45, the succeeding processes are divided into the following two cases, and proceed in a divided manner:

(a) where the determination unit 100b of the control device 100 has determined that the flow-rate difference of helium gas is not higher than the error determining threshold value $Th_1$ so that the flow-rate difference is in a negligible level, and that there is no leakage of helium gas into the vacuum container 11, and (b) where the determination unit 100b of the control device 100 has determined that the flow-rate difference of helium gas exceeds the error determining threshold value $Th_1$ so that the flow-rate difference is in a non-negligible level, and that there is any leakage of helium gas into the vacuum container 11.

First, in the case (a) when, in step S45, the determination unit 100b of the control device 100 has determined that there is no leakage of helium gas into the vacuum container 11, the sequence proceeds to step S46a under control of the control unit 100c of the control device 100.

Moreover, in the case (b) where, in step S45, the determination unit 100b of the control device 100 has determined that there is any leakage of helium gas into the vacuum container 11, the sequence proceeds to step S46b under control of the control unit 100c of the control device 100.

(Step S46a)

Under control of the control unit 100c of the control device 100, a plasma doping process is carried out in accordance with set conditions so that a desired amount of impurity is introduced onto the surface of the sample 6, and the sequence proceeds to step S48a.

(Step S48a)

Upon completion of the introduction of the desired amount of impurity onto the sample 6 under control of the control unit 100c of the control device 100, the sequence proceeds to step S49a.

(Step S49a)

Next, under control of the control unit 100c of the control device 100, the sample that has been subjected to the plasma doping process is taken out from the vacuum container 11, by using a know method or the like, not shown, and after a next sample has been loaded into the vacuum container 11, the sequence proceeds to step S41 so that the plasma doping process is carried out.

(Step S46b)

Here, under control of the control unit 100c of the control device 100, parameters of the plasma doping process are corrected.

After step S46b, the sequence proceeds to either one of the following two methods in a divided manner:

method 1: Correction of the concentration of the plasma doping gas, and method 2: Correction of the plasma doping period of time.

In this case, for example, either of the methods is preliminarily selected by the operator, and the selection information is stored in the storage unit 101; thus, by referring to the selection information stored in the storage unit 101, the control unit 100c of the control device 100 is allowed to automatically select either of the methods.

First, in the case where the method 1, that is, correction of the concentration of the plasma doping gas, is executed, the sequence proceeds to step S47-1 under control of the control unit 100c of the control device 100.

Moreover, in the case where the method 2, that is, correction of the plasma doping period of time, is executed, the sequence proceeds to step S47-2 under control of the control unit 100c of the control device 100.

(Step S47-1)

Under control of the control unit 100c of the control device 100, after corrections have been made so that a flow rate (Fb−fb) $cm^3$/min, obtained by subtracting a leakage amount fb $cm^3$/min into the vacuum container 11 of helium gas determined by the determination unit 100b of the control device 100 in step S45 from the flow rate Fb $cm^3$/min of a diluting gas supplied from the gas supply device 10, is supplied by the gas supply device 10, the sequence proceeds to step S48b. For example, in the case where, with the diluting gas being supplied at Fb=10.0 $cm^3$/min in step S43, the determination unit 100b of the control device 100 has determined in step S45 that the substrate-cooling helium gas that is the same as the diluting gas is leaking at fb=2.0 $cm^3$/min, the flow rate Fb of the diluting gas from the gas supply device 10 is corrected to (Fb−fb)=(10.0−2.0) $cm^3$/min, that is, 8.0 $cm^3$/min, so that the supply thereof is corrected correspondingly under control of the control unit 100c of the control device 100. Thus, the concentration of the plasma doping gas inside the vacuum container 11 can be kept constant.

In this manner, in the case where the concentration of the plasma doping gas is corrected in accordance with the present method 1, the correction of the plasma doping process can be made in response to a leakage of the substrate-cooling helium gas without the necessity of changing the entire processing tact time of plasma doping.

Here, upon correcting the concentration of the plasma doping gas, the flow rate Fb of the diluting gas is reduced by the amount of leakage fb, as it is, in the above description; however, not limited to this, the flow rate of the diluting gas is preferably reduced within the range of 90% to 110% of the amount of leakage. The reason for this is because, when the flow rate of the diluting gas is reduced by a rate exceeding 110% of the amount of leakage, the impurity concentration inside the vacuum container increases, with the result that the amount of introduction of the impurity onto the substrate 6 within a desired period of time increases, resulting in a problem in which more impurity than the desired amount of introduction of the impurity to the substrate 6 is introduced. Moreover, when the flow rate of the diluting gas is reduced by a rate less than 90% of the amount of leakage, a problem arises in which the concentration of impurity in the vacuum container reduces, with the result that the amount of introduction of the impurity within a desired period of time is reduced, resulting in a problem in which less impurity than the desired amount of introduction of the impurity is introduced to the substrate 6. In order to prevent these problems, the flow rate of the diluting gas is preferably reduced within the range of 90% to 110% of the amount of leakage. Moreover, taking this range into account is desirable also from the viewpoints of taking into account the error permissible range of the supply flow rate of the gas supply device 10, or the measuring error permissible range of the flow-rate measuring device, or the error permissible range of the control of the control unit 100c of the control device 100.

(Step S47-2)

After determining the relationship information (for example, relationship information of FIG. 13) between the different amounts of desired diluting gas and the plasma doping times stored in the storage unit 101 by the determination unit 100b of the control device 100 and then correcting the plasma doping time so as to obtain a desired sheet resistance, under control of the control unit 100c of the control device 100, the sequence proceeds to step S48b. In the case of the correction of the plasma doping time in accordance with the present method 2, the correcting process can be carried out by slightly prolonging the processing tact time of the plasma doping. For example, in the case where, with the process being carried out in a plasma doping time of Y seconds in step S43, the determination unit 100b of the control device 100 has determined in step S45 that the substrate-cooling helium gas that is the same as the diluting gas is leaking at 2.0 $cm^3$/min, supposing that $fb_2$ is 2.0 $cm^3$/min based upon the relationship information (for example, relationship information of FIG. 13) between the amount of a diluting gas and the plasma doping time under control of the control unit 100c of the control device 100, the period of time required for introducing desired impurity to the substrate 6 is γ seconds. Moreover, the period of time, required for introducing desired impurity to the substrate 6 in the case of no leakage of the substrate-cooling helium gas, is α seconds. By correcting the plasma doping time by (γ−α) seconds, that is, to ((Y+(γ−α)) seconds, it becomes possible to introduce the desired impurity onto the substrate 6.

(Step S48b)

Upon completion of the introduction of a desired amount of impurity onto the sample 6 by carrying out a plasma doping process in accordance with set conditions except for the conditions set in the aforementioned step S47-1 or step S47-2, under control of the control unit 100c of the control device 100, the sequence proceeds to step S49b.

(Step S49b)

Under control of the control unit 100c of the control device 100, the determination unit 100b of the control device 100 determines whether or not the next sample 6 should be loaded into the vacuum container 11 so as to be subjected to the plasma doping process, based upon measurements of the amount of leaking helium into the vacuum container 11 in step S44. This determination is carried out by using a processing permissible threshold value $Th_2$ that is another of the two or more threshold values preliminarily stored in the storage unit 101, with the processing permissible threshold value $Th_2$ serving as the reference for the determination by the determination unit 100b of the control device 100.

After step S49b, the succeeding processes are divided into the following two cases, and the sequences proceed in a divided manner:

step S49c: where, although there is a leakage of helium gas in the vacuum container 11, the sequence of processes is allowed to proceed since the determination unit 100b of the control device 100 has determined that the amount of leakage is not more than the processing permissible threshold value $Th_2$ of step S49b; and step S410b: where, there is a leakage of helium gas in the vacuum container 11, and the sequence of processes is suspended since the determination unit 100b of the control device 100 has determined that the amount of leakage exceeds the processing permissible threshold value $Th_2$ of step S49b.

(Step S410b)

Next, under control of the control unit 100c of the control device 100, the sample 6 that has been subjected to the plasma doping process is taken out from the vacuum container 11, by using a know method or the like, not shown, and without loading the next sample 6 into the vacuum container 11, the sequence proceeds to step S411b.

(Step S411b)

Under control of the control unit 100c of the control device 100, the plasma doping process of the sample 6 in the plasma doping processing device is suspended, and the sequence proceeds to step S412b.

(Step S412b)

The fact that the helium gas, supplied between the sample 6 and the lower electrode 3, leaks into the vacuum container 11 indicates that the sample 6 is not electrostatically adsorbed onto the lower electrode 3 correctly. This phenomenon occurs due to particles on the lower electrode 3 in most cases. Therefore, a particle removing operation is carried out on the lower electrode 3. The particle removing operation is carried out by using a known operation, not shown, that can be executed without the necessity of exposing the vacuum container 11 to the atmosphere, and the sequence proceeds step S413b.

(Step S413b)

Under control of the control unit 100c of the control device 100, after a dummy substrate having the same size and material as those of a substrate 6 that is subjected to the plasma doping process is put into the vacuum container 11 in place of the sample 6, the determination unit 100b of the control device 100 carries out a determination as to whether or not the leakage of helium gas into the vacuum container 11 has been corrected. This determination is carried out by using the processing permissible threshold value $Th_2$ that is another of the above-described two or more threshold values, with the processing permissible threshold value $Th_2$ serving as the reference for the determination by the determination unit 100b of the control device 100.

After step S413b, the succeeding processes are divided into the following two cases, and proceed in a divided manner:

(c) where the determination unit 100b of the control device 100 has determined that the leakage of helium gas has been corrected because the amount of helium leakage into the vacuum container 11 is not more than the processing permissible threshold value $Th_2$; and (d) where the determination unit 100b of the control device 100 has determined that the leakage of helium gas has not been corrected because the amount of helium leakage into the vacuum container 11 exceeds the processing permissible threshold value $Th_2$.

First, in the case where the determination unit 100b of the control device 100 has determined that the leakage of helium gas into the vacuum container 11 has been corrected in the above-mentioned case (c), the sequence proceeds to step S414b.

Moreover, in the case where the determination unit 100b of the control device 100 has determined that the leakage of helium gas into the vacuum container 11 has not been corrected in the above-mentioned case (d), the sequence proceeds to step S415(b).

(Step S414b)

Under control of the control unit 100c of the control device 100, a sample 6 is loaded into the vacuum container 11, and the sequence proceeds to step S41 so that the plasma doping process is continuously carried out.

(Step S415b)

In the case where the leakage of helium gas into the vacuum container 11 has not been corrected, the lower electrode 3 inside the vacuum container 11 is subjected to maintenance, and a known transporting system (transporting device or the like), not shown, is also subjected to maintenance.

In this manner, the correction of plasma doping parameters is executed by using at least one of step S47-1 and step S47-2 in FIG. 4.

Here, in the above-mentioned embodiment, upon supplying the plasma doping gas into the vacuum container 11 from the plasma doping gas supply device 10, the total flow rate of the plasma doping gas containing boron and diluted by a rare gas or hydrogen, is preferably set to 500×X cm$^3$/min or less, supposing that the error determination threshold value of the amount of leakage into the vacuum container 11 of the substrate-cooling gas to be supplied between the substrate 6 and the lower electrode 3 is set to X cm$^3$/min. The reason for this is described below.

In the case where the amount of leakage into the vacuum container 11 of the substrate-cooling helium gas is such a low rate, for example, 0.01% relative to the amount of the diluting gas, as to hardly give any effects, there is no need to apply the embodiment of the present invention. For this reason, the total flow rate is preferably set to the above-mentioned rate, 500×X cm³/min, or less, so as to indicate the greatest flow rate that allows the application of the embodiment of the present invention.

Here, the amount of leakage into the vacuum container of the substrate-cooling helium gas needs to have a rate of 0.2% or more in the minimum level, relative to the flow rate of the diluting gas. As described in the present specification, by measuring the sheet resistance of the substrate instead of measuring the amount of the impurity introduced onto the substrate, it becomes possible to confirm whether or not the substrate-cooling helium is leaking into the vacuum container to cause a reduction in the amount of the impurity introduced onto the substrate. However, there is a measuring limit to the measuring device of the sheet resistance. The rate of 0.2% or more is required for confirming the difference in the impurity concentration by measuring the sheet resistance. Consequently, the flow rate of the diluting gas required for setting the above-mentioned flow rate to 0.2% or more needs to be set equal to or lower than 500 times as high as the flow rate of the substrate-cooling helium gas. Moreover, since the minimum amount of leakage of the substrate-cooling helium gas, required for determining that there is a helium gas leakage, corresponds to the error determining threshold value $Th_1$, the amount of the diluting gas needs to be set to $(500 \times Th_1)$ or less. Therefore, as described above, supposing that the error determination threshold value is set to X cm³/min, the total flow rate of the plasma doping gas is preferably set to 500×X cm³/min or less.

The following description will discuss working examples to which the present invention is applied.

Working Example 1

By using the plasma doping processing device shown in FIG. 1A, the concentration of a plasma doping gas that is one of parameters of plasma doping was corrected.

In FIG. 1A, the lower electrode 3 on which a sample 6 made of a silicon substrate is placed is arranged inside the vacuum container 11. By using the gas supply device 10a placed in the gas supply device 10, an He-based $B_2H_6$ gas (hereinafter, referred to as $B_2H_6$/He gas) containing a desired impurity element is supplied into the vacuum container 11 as one example of a doping material gas, while an He gas is supplied by using the gas supply device 10b as one example of a diluting gas, and these gases are supplied into the vacuum container 11 as a plasma doping gas through the gas supply inlet 9 via the gas supply pipe 42. The pressure-adjusting valve 2, used for maintaining the pressure inside the vacuum container 11 at a constant pressure is installed, and the supplied gas is allowed to pass through the vacuum container 11, and discharged by the exhaust pump 1 through the pressure-adjusting valve 2. The quartz top plate serving as the dielectric window 7 is arranged on the upper surface of the vacuum container 11, and the plasma exciting coil 8 are arranged thereon. The high-frequency power supply 5 with 13.56 MHz is connected to the coil 8 so that the high frequency power can be supplied to the coil 8. An electric field, generated by the high frequency power of 13.56 MHz supplied to the coil 8, is supplied into the vacuum container 11 through the dielectric window 7. The doping material gas $B_2H_6$/He and the diluting He gas, supplied into the vacuum container 11, receive energy from the electric field to be formed into a plasma state, such as ions or radicals, that gives influences to a plasma doping process. The high-frequency power supply 4 with 13.56 MHz is connected to the lower electrode 3 so that a desired voltage can be generated in the lower electrode 3, and a voltage generated by the lower electrode 3 has a negative electric potential to the plasma. By using the voltage having the negative electric potential, boron ions in the plasma are introduced into the surface of a sample 6. Moreover, by supplying a voltage to the electrostatic adsorption electrode 18 installed inside the lower electrode 3 by using the DC power supply 19, the sample 6 is electrostatically adsorbed onto the lower electrode 3, and between the sample 6 and the lower electrode 3, the substrate-cooling He gas is supplied in the closed loop control system in FIG. 2.

Figure 9:
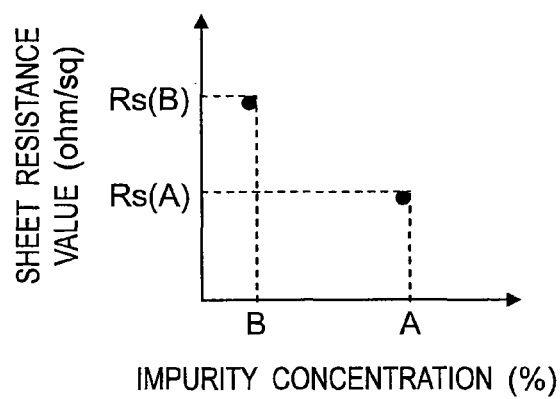
FIG. 9 is a graph that shows relationship information between an impurity concentration and a sheet resistance in the plasma doping processing device in accordance with the embodiment of the present invention.

FIG. 9 shows relationship information between an impurity concentration and a sheet resistance in the case where an impurity gas concentration A is higher than an impurity gas concentration B, supposing that the impurity gas concentration is represented by A with the sheet resistance value in this case being set to Rs (A), while the impurity gas concentration is represented by B with the sheet resistance value in this case being set to Rs (B).

Figure 10:
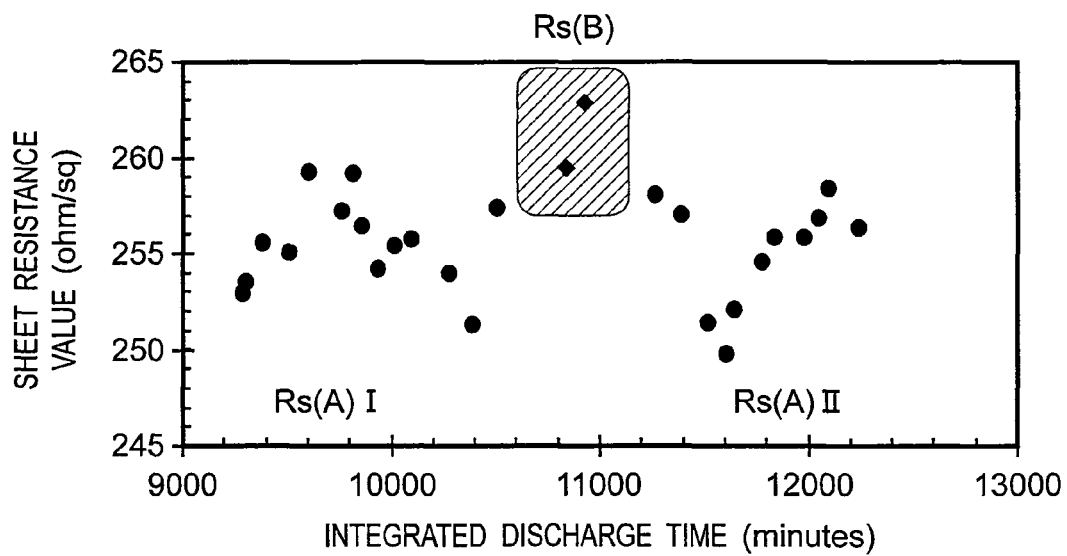
FIG. 10 is a graph that shows relationship information between a sheet resistance prior to the parameter correction for plasma doping and an integrated discharge time in the plasma doping processing device in accordance with the embodiment of the present invention.
Figure 11:
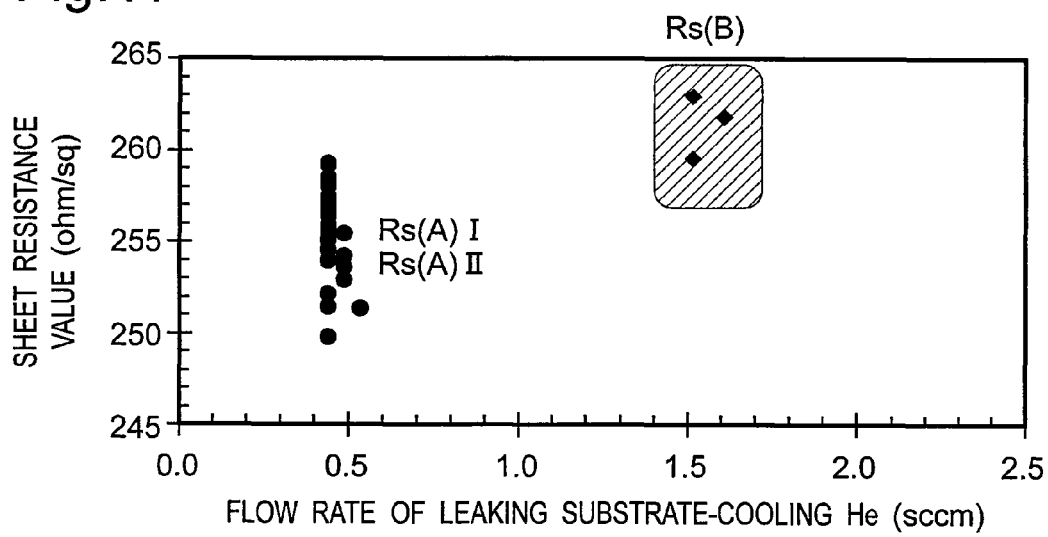
FIG. 11 is a graph that shows relationship information between a sheet resistance and a leaking flow rate of substrate-cooling helium in the plasma doping processing device in accordance with the embodiment of the present invention.
Figure 12:
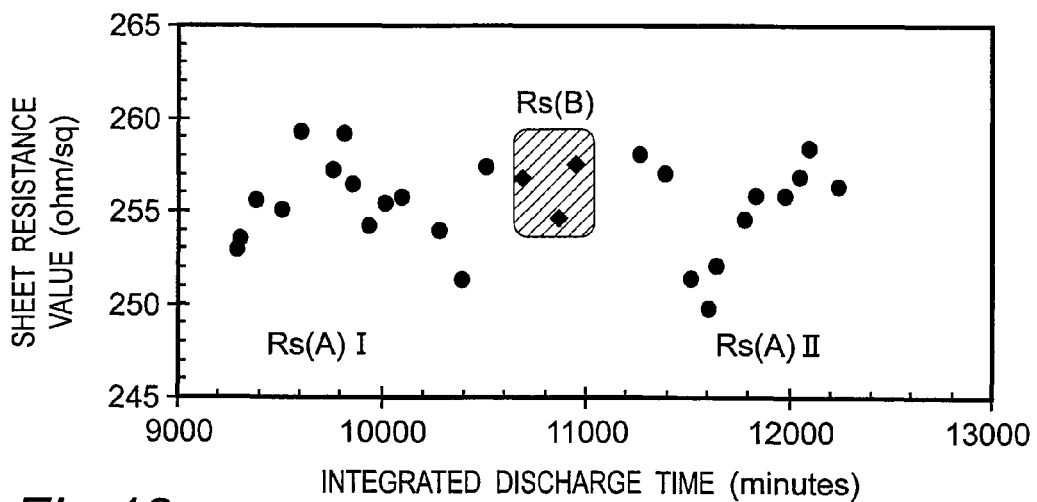
FIG. 12 is a graph that shows relationship information between a sheet resistance after the parameter correction for plasma doping and an integrated discharge time in the plasma doping processing device in accordance with the embodiment of the present invention.

FIG. 10 shows groups of many sheet resistance values, Rs (A) I and Rs (A) II in the case of no leakage into the vacuum chamber 11 of He gas supplied between the sample 6 and the lower electrode 3, and a group of many sheet resistance values, Rs (B) in the case of a leakage into the vacuum chamber 11 of He gas supplied between the sample 6 and the lower electrode 3. FIG. 11 shows the relationship between a flow rate of helium gas and groups of many sheet resistance values, Rs (A) I, Rs (A) II, and Rs (B). Here, the parameter correcting step (concentration correcting step for plasma doping gas) S47-1 for plasma doping, shown in FIG. 4, is carried out on the group Rs (B) of many sheet resistance values in the case of a leakage into the vacuum chamber 11 of He gas. As shown in FIG. 11, under control of the control unit 100c of the control device 100, the determination unit 100b of the control device 100 determines that the helium gas is leaking into the vacuum container 11 at a flow rate of 1.1 cm³/min so that a plasma doping process is carried out, with the flow rate of He in the diluting gas to be supplied from the gas supply device 10 to the vacuum container 11 being reduced by the flow rate of 1.1 cm³/min, under control of the control unit 100c of the control device 100. This sample 6 is taken out of the vacuum container 11, by using a conventionally known method or the like, not shown, under control of the control unit 100c of the control device 100, and the sample 6 is loaded into an annealing device, not shown, so that the impurity of the sample 6 is electrically excited by the annealing process, and its sheet resistance is measured by using a four-probe method or the like. In FIG. 12, the group Rs (B) of many sheet resistance values indicate the values of sheet resistance values of the samples 6, each having been plasma-doped with a correction of plasma doping gas concentration that is one of parameters of plasma doping, as shown in step S47-1 in FIG. 4, being carried out thereon.

Here, even in the case where each of gases $BF_2$, $AsH_3$, $PH_3$, and $B_nH_m$ is supplied into the vacuum container 11 as the doping material gas in place of $B_2H_6$, it is possible to obtain the same results.

Working Example 2

By using the plasma doping processing device shown in FIG. 1A, the plasma doping time that is one of parameters of plasma doping was corrected.

In FIG. 1A, the lower electrode 3 on which a sample 6 made of a silicon substrate is placed is arranged inside the vacuum container 11. By using the gas supply device 10a placed in the gas supply device 10, a $B_2H_6$/He gas containing a desired impurity element is supplied into the vacuum container 11 as one example of a doping material gas, while an He gas is supplied by using the gas supply device 10b as one example of a diluting gas, and these gases are supplied into the vacuum container 11 as a plasma doping gas through the gas supply inlet 9 via the gas supply pipe 42. The pressure-adjusting valve 2, used for maintaining the pressure inside the vacuum container 11 at a constant pressure, is installed, and the supplied gas is allowed to pass through the vacuum container 11, and discharged by the exhaust pump 1 through the pressure-adjusting valve 2. The quartz top plate serving as the dielectric window 7 is arranged on the upper surface of the vacuum container 11, and the plasma generating coil 8 are arranged thereon. The high-frequency power supply 5 with 13.56 MHz is connected to the coil 8 so that the high frequency power can be supplied to the coil 8. An electric field, generated by the high frequency power of 13.56 MHz supplied to the coil 8, is supplied into the vacuum container 11 through the dielectric window 7. The doping material gas and the diluting He gas, supplied into the vacuum container 11, receive energy from the electric field to be formed into a plasma state, such as ions or radicals, that gives influences to a plasma doping process. The high-frequency power supply 4 with 13.56 MHz is connected to the lower electrode 3 so that a desired voltage can be generated in the lower electrode 3, and a voltage generated by the lower electrode 3 has a negative electric potential to the plasma. By using the voltage having the negative electric potential, boron ions in the plasma are introduced into the surface of a sample 6. Moreover, by supplying a voltage to the electrostatic adsorption electrode 18 installed inside the lower electrode 3 by using the DC power supply 19, the sample 6 is electrostatically adsorbed onto the lower electrode 3, and between the sample 6 and the lower electrode 3, the substrate-cooling He gas is supplied in the closed loop control system in FIG. 2.

FIG. 10 shows groups of many sheet resistance values, Rs (A) I and Rs (A) II in the case of no leakage into the vacuum chamber 11 of He gas supplied between the sample 6 and the lower electrode 3, and a group of many sheet resistance values, Rs (B) in the case of a leakage into the vacuum chamber 11 of He gas supplied between the sample 6 and the lower electrode 3. FIG. 11 shows the relationship between a flow rate of helium gas and groups of many sheet resistance values, Rs (A) I, Rs (A) II, and Rs (B). Here, the parameter correcting step S47-2 for plasma doping, shown in FIG. 4, is carried out on the group Rs (B) of many sheet resistance values in the case of a leakage into the vacuum chamber 11 of He gas. As shown in FIG. 11, under control of the control unit 100c of the control device 100, the determination unit 100b of the control device 100 determines that the helium gas is leaking into the vacuum container 11 at a flow rate of 1.1 cm³/min, and under control of the control unit 100c of the control device 100, the plasma doping time is corrected so that the plasma doping time is increased by +7 seconds, and a plasma doping process is carried out. This sample 6 is taken out of the vacuum container 11, by using a conventionally known method or the like, not shown, under control of the control unit 100c of the control device 100, and the sample 6 is loaded into an annealing device, not shown, so that the impurity of the sample 6 is electrically excited by the annealing process, and its sheet resistance is measured by using a four-probe method or the like. In FIG. 12, the group Rs (B) of many sheet resistance values indicate the values of sheet resistance values of the samples 6, each having been plasma-doped with a correction of plasma doping time that is one of parameters of plasma doping of plasma doping parameter steps S47-2 in FIG. 4 (correcting step of the plasma doping period of time).

Here, even in the case where each of gases $BF_2$, $AsH_3$, $PH_3$, and $B_nH_m$ is supplied into the vacuum container 11 as the doping material gas in place of $B_2H_6$, it is possible to obtain the same results.

By properly combining the arbitrary embodiments of the aforementioned various embodiments, the effects possessed by the embodiments can be produced.

INDUSTRIAL APPLICABILITY

In accordance with the plasma doping processing device and method of the present invention, even in the case where, upon introducing an impurity into a sample such as a substrate by a plasma doping method, a substrate-cooling helium gas leaks out into a vacuum container, it becomes possible to correct fluctuations in a sheet resistance value due to the leakage of the substrate-cooling helium gas into the vacuum container; therefore, the present invention is useful for a plasma doping processing device and method by which, in particular, an impurity is introduced onto a surface of a substrate serving as a solid-state sample for a semiconductor substrate and the like in semiconductor manufacturing device and manufacturing method.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A plasma doping processing device comprising:
a vacuum container having a top plate on an upper portion thereof;
a lower electrode that is arranged in the vacuum container, with a substrate serving as a sample being mounted thereon;
a high frequency power supply for applying a high frequency power to the lower electrode;
a gas exhausting device for exhausting inside of the vacuum container; and
a plasma doping gas supply device for supplying a plasma doping gas that contains a doping material gas containing an impurity and a diluting gas into the vacuum container,
the plasma doping processing device comprising:
a flow-rate measuring device for measuring a flow rate of a substrate-cooling gas supplied between the substrate and the lower electrode so as to measure an amount of leakage of the substrate-cooling gas into the vacuum container;
a storage unit for storing relationship information between a plasma doping time and an amount of introduction of the impurity onto the substrate, and selection information correction of which parameter of plasma doping among a concentration of the plasma doping gas and the plasma doping time is carried out, and
a control device comprising a control unit for carrying out operation control of the plasma doping, and a determining unit for determining whether or not the substrate-cooling gas is leaked into the vacuum container based upon the amount of leakage controlled by the control unit and measured by the flow-rate measuring device,
wherein the control unit of the control device automatically selects either one parameter of the plasma doping among the concentration of the plasma doping gas and the plasma doping time while referring to the selection information stored in the storage unit, in a case where the determining unit determines that the substrate-cooling gas is leaked into the vacuum container, and when correction of the plasma doping time is selected, a period of the plasma doping processing time is determined based on the relationship information between the plasma doping time and the amount of the introduction of the impurity onto the substrate stored in the storage unit, the control unit of the control device controls operation of the high frequency power supply, the gas exhausting device, and the plasma doping gas supply device so as to prolong the plasma doping time up to the time thus determined, and when correction of the concentration of the plasma doping gas is selected, the control unit of the control device controls operation of the plasma doping gas supply device so as to reduce the amount of supply of the diluting gas that is equivalent to the amount of leakage measured by the flow-rate measuring device, thus controlling operation of the plasma doping gas supply device so as to reduce the amount of supply of the diluting gas in accordance with the amount of leakage measured by the flow-rate measuring device.

2. The plasma doping processing device according to claim 1, wherein the control unit of the control device controls operation of the plasma doping gas supply device so as to reduce the amount of supply of the diluting gas within a flow rate ranging from 110% to 90% of the amount of leakage measured by the flow-rate measuring device, so that operation of the plasma doping gas supply device is controlled so as to reduce the amount of supply of the diluting gas in accordance with the amount of leakage measured by the flow-rate measuring device.

3. The plasma doping processing device according to claim 1, wherein in a case where it is determined by the determining unit that the amount of leakage measured by the flow-rate measuring device is not more than an error determining threshold value, the control unit of the control device carries out a plasma doping process without carrying out the correction of the parameter of the plasma doping, while in a case where it is determined by the determining unit that the amount of leakage measured by the flow-rate measuring device is more than the error determining threshold value, the control unit of the control device carries out a plasma doping process after the correction of the parameter of the plasma doping is carried out.

4. The plasma doping processing device according to claim 1, wherein in a case where it is determined by the determining unit that the amount of leakage measured by the flow-rate measuring device is not more than a processing permissible threshold value, the control unit of the control device carries out a plasma doping process after the correction of the parameter of the plasma doping is carried out, while in a case where it is determined by the determining unit that the amount of leakage measured by the flow-rate measuring device is more than the processing permissible threshold value, the control unit of the control device stops a plasma doping process.

5. The plasma doping processing device according to claim 1, wherein the substrate-cooling gas is a helium gas.

6. The plasma doping processing device according to claim 1, wherein the plasma doping gas supply device is a device for supplying a gas containing $B_2H_6$ as the doping material gas.

7. The plasma doping processing device according to claim 1, wherein the plasma doping gas supply device is a device for supplying a gas that contains boron and is diluted by rare gas or hydrogen, as the plasma doping gas.

8. The plasma doping processing device according to claim 1, wherein the plasma doping gas supply device is a device for supplying a gas that contains boron and is diluted by helium or hydrogen, as the plasma doping gas.

9. The plasma doping processing device according to claim 1, wherein the plasma doping gas supply device is a device for supplying a gas that contains the impurity and is diluted by rare gas or hydrogen, as the plasma doping gas, with the doping material gas containing the impurity having a concentration of 5.0 mass % or less.

10. A plasma doping processing method comprising:

placing a substrate on a lower electrode that is arranged in a vacuum container having a top plate on an upper portion thereof;

applying a high frequency power from a high frequency power supply to the lower electrode, with the vacuum container being exhausted by a gas exhausting device, while supplying a plasma doping gas that contains a doping material gas containing an impurity and a diluting gas into the vacuum container from a plasma doping gas supply device;

supplying a substrate-cooling gas between the substrate and the lower electrode;

measuring a flow rate of the substrate-cooling gas so as to measure an amount of leakage of the substrate-cooling gas into the vacuum container by using a flow-rate measuring device;

determining by a determining unit of the control device whether or not the substrate-cooling gas is leaked into the vacuum container based upon the amount of leakage controlled by the control unit and measured by the flow-rate measuring device;

in a case where it is determined by the determining unit that the substrate-cooling gas is leaked into the vacuum container, automatically selecting, by the control unit, either one parameter of the plasma doping among the concentration of the plasma doping gas and the plasma doping time while referring to the selection information, that is stored in the storage unit, correction of which parameter of plasma doping among a concentration of the plasma doping gas and the plasma doping time is carried out, in a case where the determining unit determines that the substrate-cooling gas is leaked into the vacuum container, when correction of the plasma doping time is selected by the control unit, determining, by the control unit, a period of the plasma doping processing time based on relationship information, that is stored in the storage unit, between the plasma doping time and the amount of the introduction of the impurity onto the substrate, and then controlling, by the control unit, operation of the high frequency power supply, the gas exhausting device, and the plasma doping gas supply device so as to prolong the plasma doping time up to the time thus determined, and when correction of the concentration of the plasma doping gas is selected by the control unit, controlling, by the control unit, operation of the plasma doping gas supply device so as to reduce the amount of supply of the diluting gas that is equivalent to the amount of leakage measured by the flow-rate measuring device, and thus controlling, by the control unit, operation of the plasma doping gas supply device so as to reduce the amount of supply of the diluting gas in accordance with the amount of leakage measured by the flow-rate measuring device; and thereafter carrying out the plasma doping onto the substrate.

11. The plasma doping processing method according to claim 10, wherein when selecting correction of the concentration of the plasma doping gas by the control unit and controlling operation of the plasma doping gas supply device by using the control unit of the control device, the control unit of the control device controls operation of the plasma doping gas supply device so that, based upon relationship information between a flow rate of the diluting gas to be supplied into the vacuum container or a mass concentration of the impurity gas and a sheet resistance value of a dummy substrate that has a same size and is made of a same material as those of the substrate, a supply amount of the diluting gas is reduced in accordance with the amount of leakage measured by the flow-rate measuring device.

12. The plasma doping processing method according to claim 10, comprising:

when selecting correction of the concentration of the plasma doping gas by the control unit and prior to controlling operation of the plasma doping gas supply device by the control unit of the control device, carrying out the impurity plasma doping process on a dummy substrate that has a same size and is made of a same material as those of the substrate in place of the substrate so that the impurity is introduced onto the dummy substrate;

next electrically activating the impurity of the dummy substrate by using an annealing process;

next measuring a sheet resistance value of the dummy substrate, and storing results of measurements in the storage unit, and further altering the flow rate of the diluting gas, without altering the flow rate of the impurity gas to be supplied into the vacuum container, so that the impurity is introduced onto the other dummy substrate that has the same size and is made of the same material as those of the substrate;

next electrically activating the impurity of the other dummy substrate by using an annealing process;

next measuring a sheet resistance value of the other dummy substrate, and storing results of measurements in the storage unit, and storing relationship information between a flow rate of the diluting gas to be supplied into the vacuum container or a mass concentration of the impurity gas and a sheet resistance value in the storage unit; and thereafter, upon controlling operation of the plasma doping gas supply device by using the control unit of the control device, controlling operation of the plasma doping gas supply device by the control unit of the control device so that, based upon the relationship information between the flow rate of the diluting gas to be supplied into the vacuum container or the mass concentration of the impurity gas and the sheet resistance value of the dummy substrate that has the same size and is made of the same material as those of the substrate, a supply amount of the diluting gas is reduced in accordance with the amount of leakage measured by the flow-rate measuring device.

13. The plasma doping processing method according to claim 10, comprising:

when selecting correction of the concentration of the plasma doping gas by the control unit and prior to controlling operation of the plasma doping gas supply device by the control unit of the control device, carrying out the impurity plasma doping process on a dummy substrate that has a same size and is made of a same material as those of the substrate in place of the substrate so that the impurity is introduced onto the dummy substrate;

next electrically activating the impurity of the dummy substrate by using an annealing process;

next measuring a sheet resistance value of the dummy substrate, and storing results of measurements in the storage unit, and further altering the plasma doping time, so that the impurity is introduced onto the other dummy substrate that has the same size and is made of the same material as those of the substrate;

next electrically activating the impurity of the other dummy substrate by using an annealing process;

next measuring a sheet resistance value of the other dummy substrate, and storing results of measurements in the storage unit, and storing relationship information between a plasma doping time and a sheet resistance value in the storage unit; and thereafter, upon controlling operation of the plasma doping gas supply device by using the control unit of the control device, controlling operation of the high-frequency power supply, the gas exhausting device, and the plasma doping gas supply device by the control unit of the control device so as to prolong the plasma doping processing time in accordance with the amount of leakage measured by the flow-rate measuring device.

14. The plasma doping processing method according to claim 10, wherein, upon controlling operation of the high-frequency power supply, the gas exhausting device, and the plasma doping gas supply device by using the control unit of the control device, in a case where it is determined by the determining unit of the control device that there is no leakage of the substrate-cooling gas into the vacuum container based upon the amount of leakage measured by the flow-rate measuring device, the plasma doping process is carried out without carrying out the correction of the parameter of the plasma doping by the control unit of the control device, while in a case where it is determined by the determining unit of the control device that there is any leakage of the substrate-cooling gas into the vacuum container based upon the amount of leakage measured by the flow-rate measuring device and correction of the plasma doping time is selected by the control unit, the control unit of the control device controls operation of the high-frequency power supply, the gas exhausting device, and the plasma doping gas supply device so as to prolong the plasma doping time to correspond to a plasma doping time found as results of comparisons between the relationship information stored in the storage unit and the amount of leakage measured by the flow-rate measuring device, under control of the control device.

15. The plasma doping processing method according to claim 10, wherein, upon controlling operation of the plasma doping gas supply device by using the control unit of the control device, in a case where it is determined by the determining unit of the control device that there is no leakage of the substrate-cooling gas into the vacuum container based upon the amount of leakage measured by the flow-rate measuring device, the plasma doping process is carried out without carrying out the correction of the parameter of the plasma doping by the control unit of the control device, while in a case where it is determined by the determining unit of the control device that there is any leakage of the substrate-cooling gas into the vacuum container based upon the amount of leakage measured by the flow-rate measuring device, the control unit of the control device controls operation of the plasma doping gas supply device so that under control of the control device, the flow rate of the substrate-cooling gas is reduced from the flow rate of the diluting gas, with the reduced amount being supplied into the vacuum container.

16. The plasma doping processing method according to claim 10, wherein the substrate-cooling gas is a helium gas.

17. The plasma doping processing method according to claim 10, wherein upon, supplying the plasma doping gas from the plasma-doping gas supply device, a gas that contains the impurity and is diluted by rare gas or hydrogen is supplied as the plasma doping gas, with the doping material gas containing the impurity having a concentration of 5.0 mass % or less.

18. The plasma doping processing method according to claim 10, wherein upon supplying the plasma doping gas from the plasma doping gas supply device, a gas that contains boron and is diluted by rare gas or hydrogen is supplied as the plasma doping gas.

19. The plasma doping processing method according to claim 18, wherein upon supplying the plasma doping gas from the plasma doping gas supply device, phosphorus is used in place of boron in the plasma doping gas.

20. The plasma doping processing method according to claim 18, wherein upon supplying the plasma doping gas from the plasma doping gas supply device, arsenic is used in place of boron in the plasma doping gas.

21. The plasma doping processing method according to claim 10, wherein upon supplying the plasma doping gas from the plasma doping gas supply device, a gas that contains $B_2H_6$ is supplied as the doping material gas.

22. The plasma doping processing method according to claim 10, wherein the substrate-cooling gas is a helium gas.

23. The plasma doping processing method according to claim 10, wherein upon supplying the plasma doping gas from the plasma doping gas supply device into the vacuum container, the plasma doping gas that contains boron and is diluted by rare gas or hydrogen has a total flow rate that is set to 500×X $cm^3$/min or less, supposing that an error determination threshold value of an amount of leakage into the vacuum container of the substrate-cooling gas to be supplied between the substrate and the lower electrode is set to X $cm^3$/min.

24. The plasma doping processing method according to claim 10, wherein upon supplying the plasma doping gas from the plasma doping gas supply device, the diluting gas for the plasma doping gas is a helium gas.

* * * * *